(12) United States Patent
Kataeva

(10) Patent No.: US 11,537,897 B2
(45) Date of Patent: Dec. 27, 2022

(54) ARTIFICIAL NEURAL NETWORK CIRCUIT TRAINING METHOD, TRAINING PROGRAM, AND TRAINING DEVICE

(71) Applicant: DENSO CORPORATION, Kariya (JP)

(72) Inventor: Irina Kataeva, Kariya (JP)

(73) Assignee: DENSO CORPORATION, Kariya (JP)

( * ) Notice: Subject to any disclaimer, the term of this patent is extended or adjusted under 35 U.S.C. 154(b) by 492 days.

(21) Appl. No.: 16/710,267

(22) Filed: Dec. 11, 2019

(65) Prior Publication Data

US 2020/0111008 A1 Apr. 9, 2020

Related U.S. Application Data

(63) Continuation of application No. PCT/JP2018/018299, filed on May 11, 2018.

(30) Foreign Application Priority Data

Jun. 19, 2017 (JP) .............................. JP2017-119686

(51) Int. Cl.
*G06N 3/08* (2006.01)
*G06N 3/04* (2006.01)
*G06N 3/063* (2006.01)
*G11C 11/54* (2006.01)

(52) U.S. Cl.
CPC .............. *G06N 3/084* (2013.01); *G06N 3/049* (2013.01); *G06N 3/0635* (2013.01); *G11C 11/54* (2013.01)

(58) Field of Classification Search
CPC ...... G06N 3/084; G06N 3/049; G06N 3/0635; G06N 3/0481; G11C 11/54; G11C 13/0004; G11C 13/0069; G11C 2213/77
See application file for complete search history.

(56) References Cited

U.S. PATENT DOCUMENTS

| 9,396,431 | B2 * | 7/2016 | Bichler ................ G06N 3/0635 |
| 9,934,463 | B2 * | 4/2018 | Seo ........................ G06N 3/088 |
| 10,740,671 | B2 * | 8/2020 | Gokmen ............... G06N 3/0454 |
| 2010/0223220 | A1 | 9/2010 | Modha et al. |
| 2010/0299296 | A1 | 11/2010 | Modha et al. |
| 2010/0299297 | A1 | 11/2010 | Breitwisch et al. |

(Continued)

FOREIGN PATENT DOCUMENTS

| WO | 2016068953 A | 5/2016 |
| WO | 2017010048 A | 1/2017 |

(Continued)

OTHER PUBLICATIONS

Hu et al., "Memristor Crossbar-Based Neuromorphic Computing System: A Case Study," in 25.10 IEEE Transactions on Neural Networks and Learning Sys. 1864-78 (2014). (Year: 2014).*

(Continued)

*Primary Examiner* — Kamran Afshar
*Assistant Examiner* — Ryan C Vaughn
(74) *Attorney, Agent, or Firm* — Maschoff Brennan

(57) ABSTRACT

A method for training an artificial neural network circuit is provided. The artificial neural network circuit includes a crossbar circuit that has a plurality of input bars, a plurality of output bars crossing the plurality of input bars, and memristors each of which includes a variable conductance element provided at corresponding one of intersections of the input bars and the output bars.

12 Claims, 16 Drawing Sheets

(56) References Cited

U.S. PATENT DOCUMENTS

| | | |
|---|---|---|
| 2011/0153533 A1 | 6/2011 | Jackson et al. |
| 2012/0011088 A1 | 1/2012 | Aparin et al. |
| 2012/0011090 A1 | 1/2012 | Tang et al. |
| 2012/0011091 A1 | 1/2012 | Aparin et al. |
| 2012/0173471 A1 | 7/2012 | Ananthanarayanan et al. |
| 2012/0265719 A1 | 10/2012 | Modha et al. |
| 2013/0311413 A1 | 11/2013 | Rose et al. |
| 2016/0336064 A1 | 11/2016 | Seo et al. |
| 2017/0017877 A1 | 1/2017 | Kataeva et al. |
| 2017/0017879 A1 | 1/2017 | Kataeva et al. |
| 2017/0316828 A1 | 11/2017 | Hu et al. |
| 2019/0035463 A1 | 1/2019 | Hu et al. |
| 2019/0147330 A1 | 5/2019 | Otsuka et al. |

FOREIGN PATENT DOCUMENTS

| | | |
|---|---|---|
| WO | 2018220957 A | 12/2018 |
| WO | 2018235448 A | 12/2018 |
| WO | 2019008951 A | 1/2019 |

OTHER PUBLICATIONS

F. Alibart et al., Pattern classification by memristive crossbar circuits using exsitu and in-situ training, Nature Comm., 2013.

F. Merrikh et al., Phenomenological Modeling of memristive devices, Applied Physics A Materials Science & Processing, pp. 779-786, Jan. 25, 2015.

K.K. Likharev et al, CrossNets: Neuromorphic hybrid CMOS/nanoelectronic networks, Science of Advances Materials vol. 3, 322-331, 2011.

Lecun Y.A., Bottou L., Orr G.B., Muller KR. (2012) Efficient BackProp. In: Montavon G., Orr G.B., Müller KR. (eds) Neural Networks: Tricks of the Trade. Lecture Notes in Computer Science, vol. 7700. Springer, Berlin, Heidelberg.

Yi-Chou et al, An Access-Transistor-Free (0T/1R) Non-Volatile Resistance Random Access Memory (RRAM) Using a Novel Threshold Switching, Self-Rectifying Chalcogenide Device, IEEE 2003.

* cited by examiner

FIG. 18

| N | σ × N | $V^{1/2}=V^{TH} - N\sigma$ | | $V^{MIN} = V^{TH} + N\sigma$ | | $V^{MAX} = \min(V_{IDEAL}^{MAX}, 2(V^{TH} - N\sigma))$ | |
|---|---|---|---|---|---|---|---|
| | | SET | RESET | SET | RESET | SET | RESET |
| 1 | 0.05 | −0.85 | 1.35 | −0.95 | 1.45 | −1.41 | 2.64 |
| 2 | 0.1 | −0.8 | 1.3 | −1.0 | 1.5 | −1.41 | 2.64 |
| 3 | 0.15 | −0.75 | 1.25 | −1.05 | 1.55 | −1.41 | 2.64 |
| 4 | 0.2 | −0.7 | 1.2 | −1.1 | 1.6 | −1.4 | 2.6 |
| 5 | 0.25 | −0.65 | 1.15 | −1.15 | 1.65 | −1.38 | 2.55 |
| 6 | 0.3 | −0.6 | 1.1 | −1.2 | 1.7 | −1.36 | 2.5 |

| $V^{1/2}=V^{TH} - N\sigma_V$ | $V^{MAX} - V^{1/2}$ | | | |
|---|---|---|---|---|
| SET | $V^{MAX}=-1.41$ | $V^{MAX}=-1.4$ | $V^{MAX}=-1.38$ | $V^{MAX}=-1.36$ |
| −0.85 | −0.56 | −0.55 | −0.53 | −0.51 |
| −0.8 | −0.61 | −0.6 | −0.58 | −0.56 |
| −0.75 | −0.66 | −0.65 | −0.63 | −0.61 |
| −0.7 | −0.71 | −0.7 | −0.68 | −0.66 |
| −0.65 | −0.76 | −0.75 | −0.73 | −0.71 |
| −0.6 | −0.81 | −0.8 | −0.78 | −0.76 |

| N≥3 | N≥1 |
|---|---|
| N≥2 | N<1 |

| $V^{1/2}=V^{TH} - N\sigma_V$ | $V^{MAX} - V^{1/2}$ | | | |
|---|---|---|---|---|
| RESET | 2.64 | 2.6 | 2.55 | 2.5 |
| 1.35 | 1.29 | 1.25 | 1.2 | 1.15 |
| 1.3 | 1.34 | 1.3 | 1.25 | 1.2 |
| 1.25 | 1.39 | 1.35 | 1.3 | 1.25 |
| 1.2 | 1.44 | 1.4 | 1.35 | 1.3 |
| 1.15 | 1.49 | 1.45 | 1.4 | 1.35 |
| 1.1 | 1.54 | 1.5 | 1.45 | 1.4 |

PARAMETER USED IN SECOND NUMERICAL EXPERIMENT

| σ | $V^{1/2}$ | | $V^{MIN}$ | | $V^{MAX}$ | | $N\sigma_V$ |
|---|---|---|---|---|---|---|---|
| | SET | RESET | SET | RESET | SET | RESET | |
| 0.01 | -0.7 | 1.3 | -0.96 | 1.46 | -1.41 | 2.64 | >3$\sigma_V$ |
| 0.05 | -0.7 | 1.25 | -1.05 | 1.55 | -1.36 | 2.5 | 3$\sigma_V$ |
| 0.1 | -0.7 | 1.2 | -1.2 | 1.7 | -1.32 | 2.4 | 2$\sigma_V$ |

PARAMETER USED IN THIRD NUMERICAL EXPERIMENT

| σ | $V^{1/3}$ | | $V^{MIN}$ | | $V^{MAX}$ | | $N\sigma_V$ |
|---|---|---|---|---|---|---|---|
| | SET | RESET | SET | RESET | SET | RESET | |
| 0.1 | −0.4 | 0.6 | −1.2 | 1.7 | −1.4 | 2.3 | $3\sigma_V$ |

ARTIFICIAL NEURAL NETWORK CIRCUIT TRAINING METHOD, TRAINING PROGRAM, AND TRAINING DEVICE

CROSS REFERENCE OF RELATED APPLICATION

The present application is a continuation application of International Patent Application No. PCT/JP2018/018299 filed on May 11, 2018 which designated the U. S. and claims the benefit of priority from Japanese Patent Application No. 2017-119686 filed on Jun. 19, 2017. The entire disclosures of all of the above applications are incorporated herein by reference.

TECHNICAL FIELD

The present disclosure relates to a training method, a training program, and a training device for an artificial neural network (hereinafter abbreviated as an artificial NN) circuit which includes a crossbar circuit equipped with memristors.

BACKGROUND

An artificial NN such as a deep neural network is overwhelming recognition performance of conventional machine learning in the field of image recognition, for example.

SUMMARY

The present disclosure describes a method for training an artificial neural network circuit, the artificial neural network circuit including a crossbar circuit that has a plurality of input bars, a plurality of output bars crossing the plurality of input bars, and memristors each of which includes a variable conductance element provided at corresponding one of intersections of the input bars and the output bars.

BRIEF DESCRIPTION OF DRAWINGS

Objects, features and advantages of the present disclosure will be more clearly understood from the following detailed description with reference to the accompanying drawings. In the drawings:

FIG. 18 is a diagram showing an example of specific numerical values of set application voltages;

DETAILED DESCRIPTION

Figure 1:
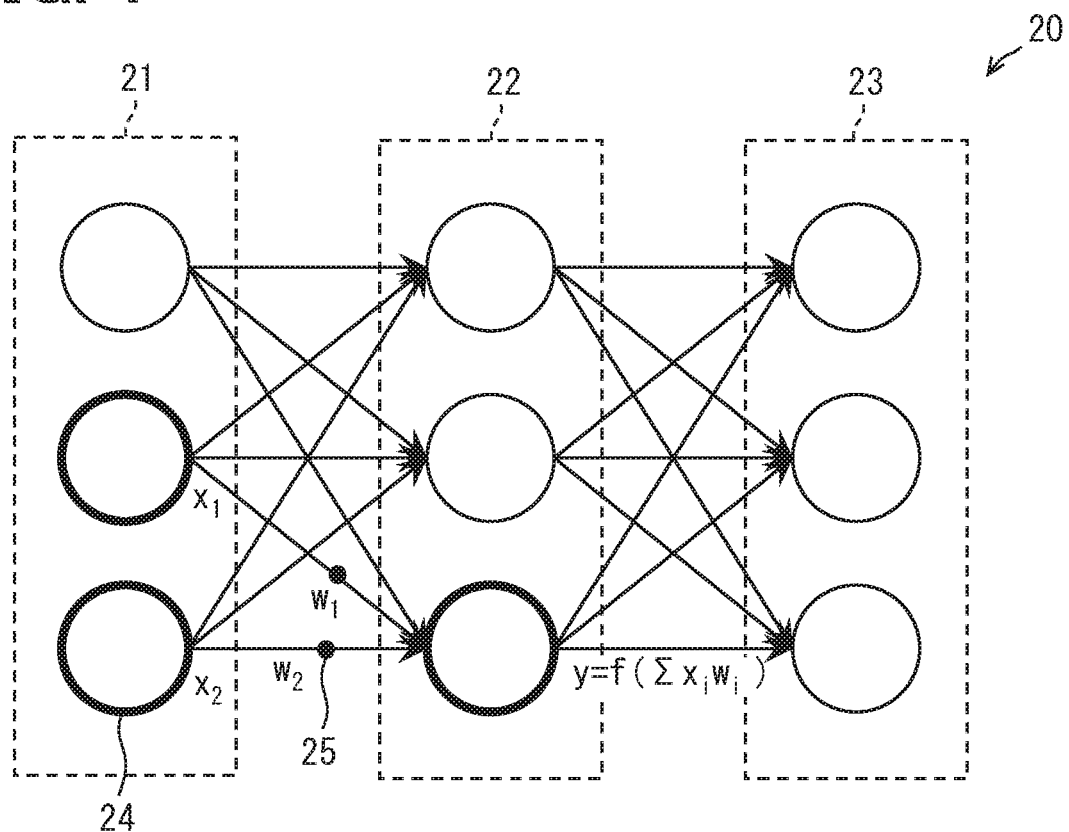
FIG. 1 is a diagram conceptually showing an example of an artificial NN implemented in hardware using an artificial NN circuit.

An artificial NN is overwhelming recognition performance of conventional machine learning in the field of image recognition, for example. An artificial NN may impose a heavy operation load. Accordingly, some of the artificial NNs are implemented in software using so-called general-purpose computing on graphic processing unit (GPGPU) which employs a GPU suitable for highly efficient parallel computation.

The GPGPU may be large-sized, and may consume a large amount of power. These points may cause difficulties in a cloud-computing-based application. These points may also cause difficulties in a non-cloud-computing-based application. For example, the non-cloud-computing-based application may be a vehicle obstacle recognition application required to achieve robustness and real-time handling for a network failure as well as low power consumption and miniaturization. Accordingly, the inventor of the present application has found that an artificial NN dedicated hardware circuit capable of achieving low-power consumption, high-speed, and miniaturization may be desired.

The inventor of the present application has been advancing research concerning an artificial NN circuit which includes a crossbar circuit equipped with variable conductance elements (hereinafter referred to as memristors) as one type of the artificial NN dedicated hardware circuit. For example, results of this research are disclosed in International Patent Application No. WO 2017/010048 A1 (corresponding to PCT/JP2016/003000 filed on Jun. 22, 2016) and International Patent Application No. WO 2017/010049 A1 (corresponding to PCT/JP2016/003001 filed on Jun. 22, 2016), which are incorporated herein by reference.

The crossbar circuit is constituted by a plurality of input bars and a plurality of output bars so disposed as to cross each other, and connected to each other at intersections via memristors. When voltage signals as outputs of neurons in a previous stage are input to the input bars of the crossbar circuit, the respective voltage signals are multiplied by conductance values of the corresponding memristors as weights, and then summed on the output bars. Thereafter, the summed voltage signal is output as an input to neurons in a subsequent stage. In this manner, synapses of the artificial NN are implemented in hardware using the crossbar circuit.

For training the artificial NN circuit including the crossbar circuit, conductance of the memristors corresponding to the weights of the synapse is updated. The conductance values of the memristors are updated based on following characteristics of the memristors.

A conductance which differs in a range between a minimum value and a maximum value in accordance with a voltage to be applied can be set for each of the memristors. For example, conductance of the memristors can be increased by applying negative write voltages using a voltage application device, and can be decreased by applying positive write voltages. Each of the memristors maintains a set conductance value unless a voltage having a magnitude equal to or higher than a positive and negative write voltage threshold is applied.

Elements adoptable as the memristors may include a Pt/TiO$_2$/Pt metal oxide element, a phase change memory, a magnetic tunnel junction memory, and the like.

The related arts describe a training method for an artificial NN circuit based on the foregoing characteristics of memristors. According to the training methods of the related arts, conductance is updated by applying write voltages each having a magnitude equal to or higher than a write voltage threshold to memristors constituting a crossbar circuit.

In each of the training methods of the related arts, it is assumed that the write voltage thresholds of the respective memristors constituting the crossbar circuit are uniform. In other words, it is assumed that the write voltage threshold of each of the memristors constituting the crossbar circuit has a specified value. Accordingly, in a state that the write voltage threshold varies from the specified value, conductance of the memristor for which conductance update is intended may not be updated, or the conductance of the memristor for which the conductance update is not intended may be changed. In this case, training accuracy may drop according to findings of the inventor of the present application.

The present disclosure describes a training method, a training program, and a training device for an artificial NN circuit, capable of reducing a drop of training accuracy caused by write voltage threshold variations of memristors.

The present disclosure describes a training method, a training program, and a training device for an artificial NN circuit, capable of reducing a drop of training accuracy caused by write voltage threshold variations of memristors. One aspect of the present disclosure provides a method for training an artificial neural network circuit. The artificial neural network circuit includes: a crossbar circuit that has a plurality of input bars, a plurality of output bars crossing the plurality of input bars, and memristors each of which includes a variable conductance element provided at a corresponding one of the intersections of the input bars and the output bars. Each of the memristors has a characteristic that conductance is updated in response to that a write voltage $V_{WRITE}$ having a magnitude equal to or higher than a write voltage threshold being applied, and that the conductance is maintained in response to that a voltage having a magnitude lower than the write voltage threshold being applied. A magnitude of the write voltage threshold has a variation with respect to a specified value $V^{TH}$. A memristor to be a target in the memristors of update of the conductance by the write voltage $V_{WRITE}$ is a selected memristor. A memristor other than the selected memristor is a non-selected memristor. Voltage $V_{50}$ is applied to an input bar to which one end of the selected memristor is connected. Voltage $V_{51}$ is applied an output bar to which a different end of the selected memristor is connected. The method is performed by a training device comprising: an application voltage setting step that sets the voltages $V_{50}$, $V_{51}$ to satisfy an relationship of $V^{TH}+dV \leq |V_{50}-V_{51}|=|V_{WRITE}| \leq 2(V^{TH}-dV)$, in which the dV is a voltage meeting a positive margin voltage, and sets voltages applied to an input bar other than the input bar to which the one end of the selected memristor is connected and an output bar other than the output bar to which the different end of the selected memristor is connected to voltages producing a voltage difference smaller than $V^{TH}-dV$ at both ends of each of the non-selected memristor; and a voltage applying step that applies the voltages set by the application voltage setting step to the input bars and the output bars with a voltage application device. A magnitude of the margin voltage is set based on a write voltage threshold variation of the memristors.

According to this training method, the write voltage having a magnitude equal to or higher than $V^{TH}+dV$ is applied to the selected memristor in the voltage applying step. The voltage dV herein is a positive margin voltage set based on the write voltage threshold variation of the memristors. Accordingly, even when the actual write voltage threshold of the selected memristor is higher than the specified value $V^{TH}$ due to variation of the write voltage threshold, a voltage having a magnitude equal to or higher than the write voltage threshold is likely to be applied to the selected memristor. Accordingly, it is possible to reduce a possibility of an unintended conductance update failure of the selected memristor.

In the crossbar circuit, the different memristors are connected to the input bar and the output bar to which one end and the other end of the selected memristor are connected, respectively. When the different memristors are non-selected memristors, it may be preferable that an unintended conductance change is not produced by the write voltage applied to the selected memristor.

According to the present training method, therefore, voltages to be applied to the other input bars and output bars are set such that a magnitude of each of the voltages applied to the non-selected memristors becomes equal to or lower than $V^{TH}-dV$. In this case, voltages each having a magnitude equal to or lower than $V^{TH}-dV$ are applied to the non-selected memristors in the voltage applying step. Accordingly, even when the actual write voltage threshold of the non-selected memristors is lower than the specified value $V^{TH}$ due to the write voltage threshold variation, voltages each having a magnitude equal to or higher than the write voltage threshold are less likely to be applied to the non-selected memristors. Accordingly, it may be possible to reduce the possibility of an unintended conductance change of the non-selected memristors.

Furthermore, according to the present training method, $2(V^{TH}-dV)$ is defined as the maximum write voltage to the selected memristor. In this case, it may be possible to easily set voltages to be applied to the respective bars such that voltages applied to the non-selected memristors each become equal to or lower than $V^{TH}-dV$.

A training program of an artificial NN circuit for achieving the above object according to the present disclosure is a program under which a computer that constitutes a training device performs the application voltage setting step and the voltage applying step described above. This program may also achieve effects similar to those of the artificial NN circuit training method. The program may be provided via a telecommunication line, or may be provided while stored in a non-transitory storage medium.

A training device of an artificial NN circuit for achieving objects according to the present disclosure is a training device which may perform the application voltage setting step and the voltage applying step. This training device may also achieve effects similar to those of the artificial NN circuit training method.

An embodiment of a training method for an artificial NN circuit according to the present disclosure will be described with reference to the drawings. Configurations of an artificial NN and an artificial NN circuit which implements the artificial NN in hardware will be hereinafter initially described. Thereafter, the training method for the artificial NN circuit will be described.

FIG. 1 conceptually shows an example of an artificial NN 20 implemented in hardware using the artificial NN circuit of the present embodiment. As shown in FIG. 1, the artificial NN 20 includes an input layer 21, an intermediate layer 22, and an output layer 23. Each of the layers includes neurons 24. The intermediate layer 22 is also called a hidden layer.

When input data is input to the input layer 21 of the artificial NN 20, outputs $x_1$, $x_2$, and up to $x_1$ corresponding to the input data are output from the respective neurons 24 of the input layer 21. The outputs $x_1$, $x_2$, and others are multiplied by weights $W_1$, $W_2$, and others as synapses, respectively, and a sum $\Sigma W_i x_i$ of the multiplied outputs is input to the neurons 24 of the intermediate layer 22. Each of the neurons 24 in the intermediate layer 22 converts the input $\Sigma W_i x_i$ using an activation function f such as ReLU or tanh. Thereafter, a converted value $f(\Sigma W_i x_i)$ is output to a subsequent layer. The subsequent layer corresponds to the output layer 23 when the artificial NN is constituted by three layers. In a case of four or more layers, the subsequent layer corresponds to a subsequent intermediate layer (not shown). The input data is converted in this manner, and finally input to the output layer 23. Each of the neurons 24 of the output layer 23 converts the input using a soft max function, for example, and outputs the converted input.

As used in this specification, the term "data" is to be construed as encompassing both multiple data and a single datum.

The artificial NN 20 thus configured is applicable to classification of an image as input data (for example, MNIST data set) into a plurality of categories (for example, numerals from 0 to 9). In this case, input data to the input layer 21 may be pixel values (for example, 0 to 255) of the image. The outputs from the respective neurons 24 of the output layer 30 may be configured to indicate probabilities of the respective categories to which the image as the input data belongs. In this case, a category corresponding to a highest probability in the probabilities output from the output layer 23 is selected to classify the image as the input data into a plurality of categories. The artificial NN 20 is also applicable to other purposes of use. For example, the artificial NN 20 is applicable to detection of an object or a person, recognition of a human face, recognition of a road sign, and the like. The weights of the synapses of the artificial NN 20 are determined by learning.

An artificial NN circuit 40 which implements the artificial NN 20 in hardware will be next described with reference to FIGS. 2 to 6.

Figure 2:
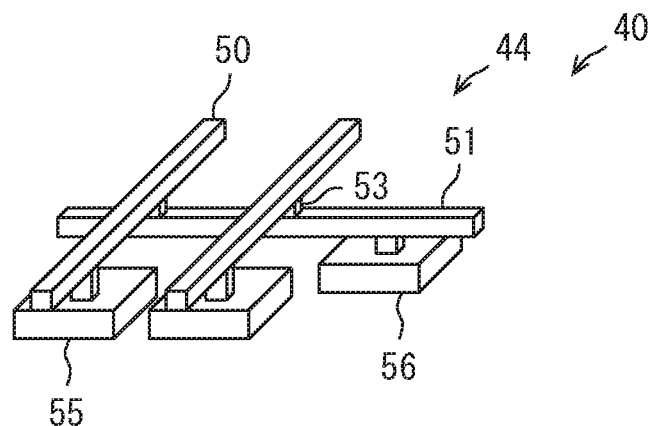
FIG. 2 is a diagram explaining a crossbar circuit constituting the artificial NN circuit.

As shown in FIG. 2, the artificial NN circuit 40 includes a crossbar circuit 44 implementing synapses in hardware, and CMOS circuits 55 and 56 implementing the neurons 24 in hardware. CMOS is an abbreviation for Complementary Metal Oxide Semiconductor. The crossbar circuit 44 includes input bars 50, output bars 51 crossing the input bars 50, and memristors 53 provided at intersections of the input bars 50 and the output bars 51. The input bars 50 and the output bars 51 are connected via the memristors 53. The CMOS circuits 55 are connected to the input bars 50. The CMOS circuits 56 are connected to the output bars 51. The CMOS circuits 55 and 56 may be provided on a CMOS circuit board. The input bars 50 and the output bars 51 constituting the crossbar circuit 44 may be provided on the CMOS circuit board on which the CMOS circuits 55 and 56 are provided.

In typical case, the crossbar circuit 44 may have a plurality of the input bars 50, a plurality of the output bars 51, and the memristors 53 provided at respective intersections of the input bars 50 and the output bars 51.

Each of the memristors 53 is a resistance random access memory which changes a resistance state (conductance) in a range between a minimum value $G_{MIN}$ and a maximum value $G_{MAX}$. A theoretical model for conductance of the memristors configured as above is disclosed in "Phenomenological Modeling of Memristive Device" Applied Physics A, vol. 118, pp. 770-786, 2015, which is incorporated herein by reference.

The conductance setting of each of the memristors 53 can be changed between the minimum value $G_{MIN}$ and the maximum value $G_{MAX}$ in accordance with a voltage to be applied. For example, conductance of each of the memristors 53 can be increased by applying a negative write voltage $V_{SET}$ using a voltage application device, and can be decreased by applying a positive write voltage $V_{RESET}$. Each of the memristors 53 maintains set conductance unless a voltage equal to or higher than the positive and negative write voltage threshold $V_{SET}^{TH}$ and $V_{RESET}^{TH}$ is applied. Elements adoptable as the memristor 53 may be a Pt/TiO$_2$/Pt metal oxide element, a phase change memory, a magnetic tunnel junction memory, and the like. In the present specification, the negative write voltage $V_{SET}$ and the positive write voltage $V_{RESET}$ are collectively referred to as a write voltage $V_{WRITE}$ in some cases. Further, the positive and negative write voltage thresholds $V_{SET}^{TH}$ and $V_{RESET}$TH are collectively referred to as a write voltage threshold in some cases.

Figure 3:
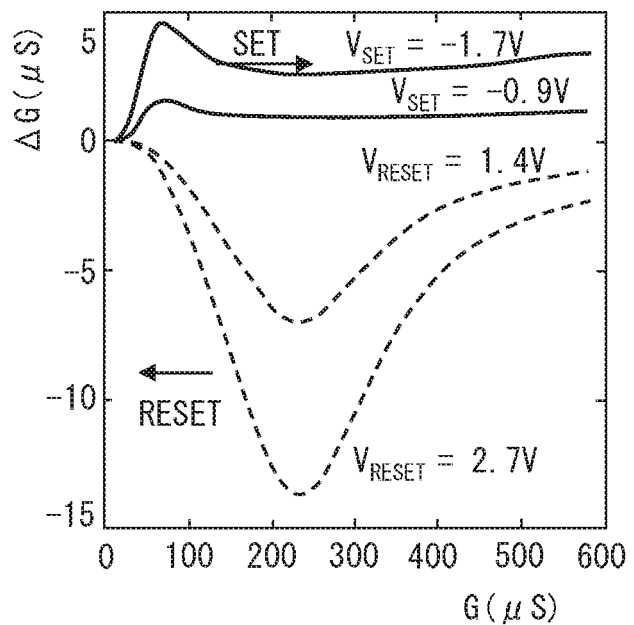
FIG. 3 is a diagram showing an example of a conductance change of a memristor with respect to a write voltage.

FIG. 3 shows an example of a conductance change amount $\Delta G$ when a positive and negative write voltage pulse is applied to a memristor having conductance G for an application time of 10 μs. This memristor is a Pt/TiO$_2$/Pt metal oxide element. The horizontal axis of FIG. 3 represents the conductance G before the write voltage is applied, while the vertical axis represents the conductance change amount $\Delta G$ after the positive and negative write voltage is applied. The conductance change amount $\Delta G$ of the memristor for each of the positive and negative write voltages is dependent on the conductance G before the write voltage is applied, and an amplitude and an application time of the write voltage (typically pulse voltage).

Figure 4:
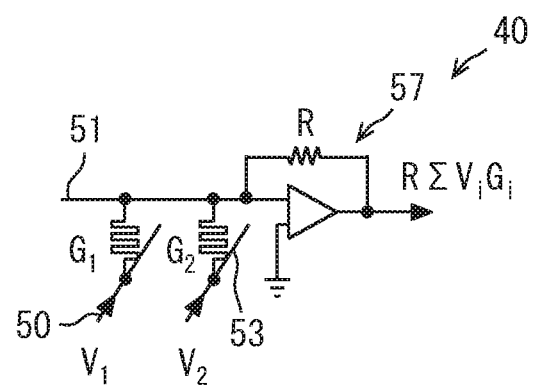
FIG. 4 is a diagram explaining a crossbar circuit.

FIG. 4 is a diagram showing an electric circuit configuration of the crossbar circuit 44 shown in FIG. 2. As shown in FIG. 4, the CMOS circuit 56 constitutes an operational amplifier. In addition, a resistor R is connected between an input and an output of the operational amplifier to constitute an adder. When input signals (voltage signals) V1 and V2 are input to the plurality of input bars 50 from the CMOS circuits 55, the voltage signals V1 and V2 are added after multiplied by conductances G1 and G2 by the memristors 53, respectively. A result of this addition is multiplied by R at the adder. A voltage output from the adder is expressed by the following Equation 1.

$$\text{Output voltage from adder} = R\Sigma V_i G_i \quad \text{(Equation 1)}$$

Thereafter, an output voltage signal from the adder is output to an activation function processing circuit (not shown) provided in the CMOS circuit 56, and converted by the activation function f. A voltage signal obtained by the conversion is output from the CMOS circuit 56.

The typical artificial NN 20 may have positive and negative weights of synapses. The crossbar circuit 44 of the present embodiment adopts a configuration of FIG. 5 to implement these positive and negative weights by the artificial NN circuit 40.

Figure 5:
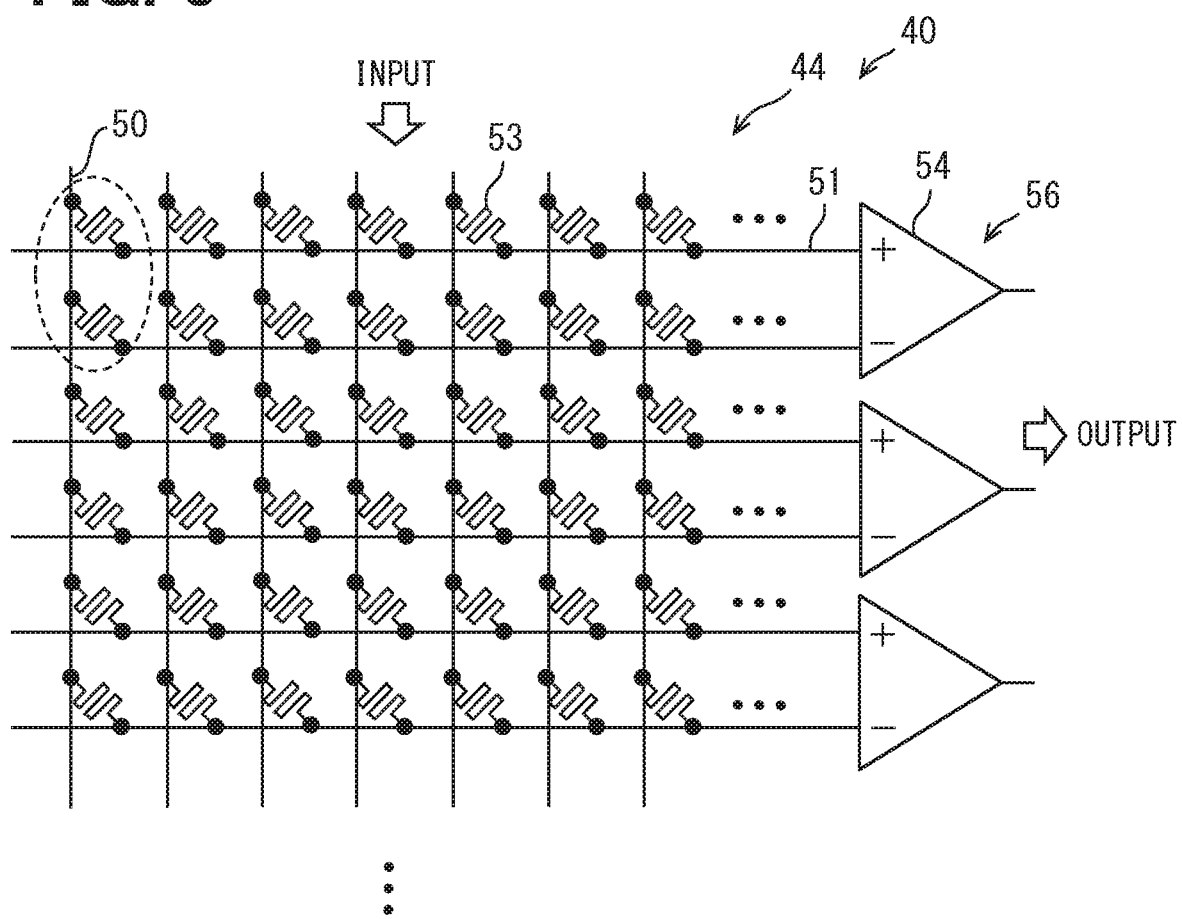
FIG. 5 is a diagram explaining the crossbar circuit.

According to the configuration of FIG. 5, each of the input bars 50 is connected to the two output bars 51 via a pair of the memristor 53 having conductance $G^+$ and the memristor 53 having conductance $G^-$. One of the two output bars 51 is connected to a non-inverting input terminal of a differential operational amplifier 54 constituted in the CMOS circuit 56, while the other is connected to an inverting input terminal of the differential operational amplifier 54. FIG. 5 does not show the adder shown in FIG. 4. In practice, the adder is provided on the input side of the differential operational amplifier 54. Moreover, FIG. 5 does not show the above-described activation function processing circuit. In practice, the activation function processing circuit is provided on the output side of the differential operational amplifier 54.

When the input signals (voltage signals) V1, V2, and up to Vi are input to the plurality of input bars 50 of the crossbar circuit 44 of FIG. 5, an output voltage from each of the differential operational amplifiers 54 connected to the pair of output bars 51 is expressed by following equation.

$$\text{Output voltage of differential operational amplifier } 54 = R\Sigma V_i(G^+i - G^-i) \quad \text{(Equation 2)}$$

In this case, $(G^+i - G^-i)$ is a value within a positive and negative range $[G_{MIN}-G_{MAX}; G_{MAX}-G_{MIN}]$. Specifically, when a certain input signal is multiplied by a positive weight, conductance of the memristor 53 provided between the output bar 51 and the input bar 50 connected to the non-inverting input terminal is set to a value higher by the positive weight to be set than conductance of the memristor 53 provided between the output bar 51 and the input bar 50 connected to the inverting input terminal. Conversely, when a certain input signal is multiplied by a negative weight, conductance of the memristor 53 provided between the output bar 51 and the input bar 50 connected to the inverting input terminal is set to a value higher by the negative weight to be set than conductance of the memristor 53 provided between the output bar 51 and the input bar 50 connected to the non-inverting input terminal. In this manner, the crossbar circuit 44 of the present embodiment implements the positive and negative weights of the synapses.

A training method for the artificial NN circuit 40 including the crossbar circuit 44 will be next described. An outline of learning of the artificial NN circuit 40 including the crossbar circuit 44 will be hereinafter initially described. Thereafter, a training device for the artificial NN circuit 40, and subsequently the training method for the artificial NN circuit 40 will be described.

The outline of the learning of the artificial NN circuit 40 including crossbar circuit 44 will be described. The learning of the artificial NN circuit 40 including the crossbar circuit 44 is implemented by updating conductance of the memristors 53 corresponding to the weights of the synapses.

Examples of the learning of the artificial NN circuit 40 described above include learning (on-chip learning) performed by propagation of an analog voltage signal within the artificial NN circuit 40. Specifically, on-chip learning can be performed in a following manner.

For example, an analog voltage signal x, which is input data (for example, MNIST data set) as teacher data, is input to the input side of the artificial NN circuit 40. Thereafter, an analog output voltage y from the artificial NN circuit 40 is measured, and a difference e=target−y, which is a difference produced between a desired analog output voltage target and the actual analog output voltage y and corresponding to a false recognition rate (for example, false recognition rate of MNIST category classification), is obtained. This propagation corresponds to forward propagation. In addition, a voltage signal corresponding to the false recognition rate e=target−y is input from the output side of the artificial NN circuit 40, and an output voltage from the input side of the artificial NN circuit 40 is measured. This propagation corresponds to backward propagation. Voltage signals in the backward propagation propagate while bypassing the activation function processing circuit, and while converted by a differential activation function processing circuit (not shown) within the respective CMOS circuits 55 and 56. The differential activation function processing circuit is a circuit for implementing a function obtained by differentiating the activation function f.

Thereafter, a conductance update amount ΔG is calculated for each conductance of the respective memristors 53 constituting the crossbar circuit 44 based on the false recognition rate obtained by the forward propagation and the output voltage obtained by the backward propagation. In addition, a write voltage to be applied to each of the memristors 53 for achieving the conductance update amount ΔG is calculated. The calculated write voltage is applied to the memristors 53 to update conductance of the memristors 53.

Details of the forward propagation and backward propagation, and the method of calculating the conductance update amount ΔG based on these propagations in the learning of the artificial NN circuit 40 described above, are mentioned in WO 2017/010048 A1 and WO 2017/010049 A1 of the inventor of the present application, and are herein incorporated by reference.

A training device and a training method for implementing the conductance update amount ΔG for each of the memristors 53 according to the present embodiment will be hereinafter described.

Figure 6:
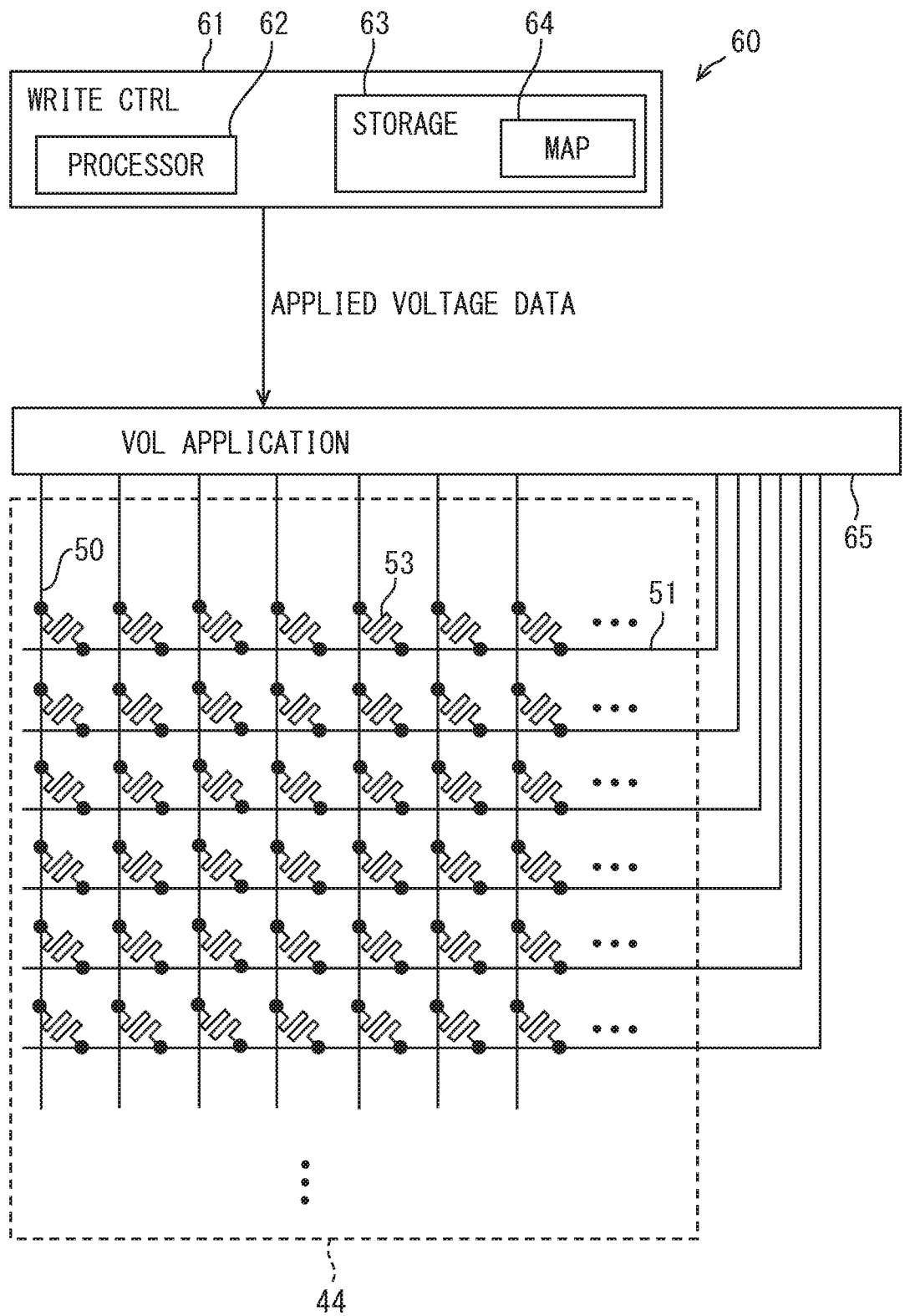
FIG. 6 is a diagram explaining a training device for the artificial NN circuit including the crossbar circuit.

FIG. 6 shows a training device which updates conductance of the memristors 53 based on the conductance update amount ΔG. A training device 60 includes a write control device 61 and a voltage application device 65.

The write control device 61 is constituted by a computer which includes a processor 62, a storage device 63, and others. The storage device 63 has a rewritable storage medium. The storage device 63 stores a conductance map 64, which indicates correspondence between the conductance update amount ΔG and the write voltage $V_{WRITE}$. Details of the conductance map 64 will be described below. The storage device 63 further stores a program under which the processor 62 performs a conductance update process. Details of the conductance update process will be described below. Incidentally, a conductance map may be referred to as a map.

The voltage application device 65 is connected to the crossbar circuit 44 to apply any voltage to the respective input bars 50 and the respective output bars 51 of the crossbar circuit 44. According to the example of FIG. 6, the voltage application device 65 is connected to the input bars 50 and the output bars 51 while bypassing the CMOS circuits 55 and 56 for implementing neurons. Accordingly, FIG. 6 does not show the CMOS circuits 55 and 56. The voltage application device 65 includes a D/A converter, and applies an analog voltage to each of the input bars 50 and the output bars 51 in accordance with application voltage digital data input from the write control device 61 under control by the write control device 61. In this manner, conductance of the memristors 53 is updated.

The conductance update process performed by the write control device 61 will be described with reference to FIG. 7.

Figure 7:
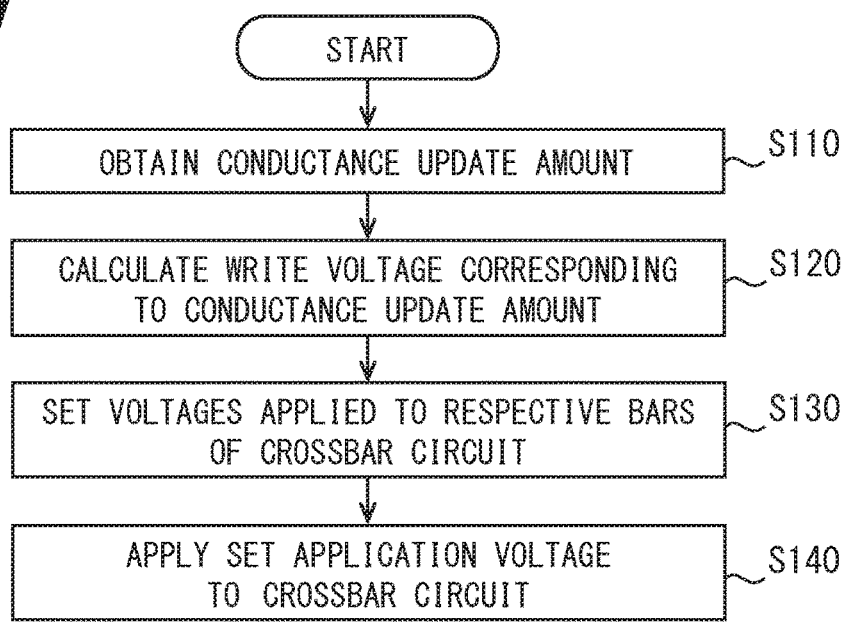
FIG. 7 is a flowchart showing a training process of the artificial NN circuit performed by a write control device.

FIG. 7 is a flowchart showing the conductance update process performed by the write control device 61 (specifically, the processor 62).

In S110, the write control device 61 obtains the conductance update amount ΔG obtained by the above-described forward propagation and backward propagation for each of the memristors 53, and stores the conductance update amount ΔG in the storage device 63.

In S120, the write control device 61 calculates write voltages $V_{SET}$ and $V_{RESET}$ corresponding to the conductance update amount ΔG obtained in S110 by using the conductance map 64 based on write voltage threshold variations of the memristors 53 constituting the crossbar circuit 44. Thereafter, the write control device 61 stores the calculated write voltages $V_{SET}$ and $V_{RESET}$ in the storage device 63. The write voltage threshold variations will be hereinafter initially described. The conductance map 64 will be subsequently described.

The write voltage threshold variations will be described. Each of the memristors 53 constituting the crossbar circuit 44 ideally has a specified value $V^{TH}$ corresponding to each of the write voltage thresholds $V_{SET}^{TH}$ and $V_{RESET}^{TH}$. In a practical situation, the write voltage threshold of each of the memristors 53 varies to some extent around the specified value for various reasons such as manufacturing errors. Accordingly, when the write voltage threshold of any one of the memristors 53 is higher than the specified value, the intended conductance update of the corresponding memristors 53 may not be achieved even after application of the write voltage. In addition, when the write voltage threshold of any one of the memristors 53 is lower than the specified value, an unintended change of conductance of the corresponding memristor 53 may be made after application of the write voltage to the different memristor 53.

Figure 8:
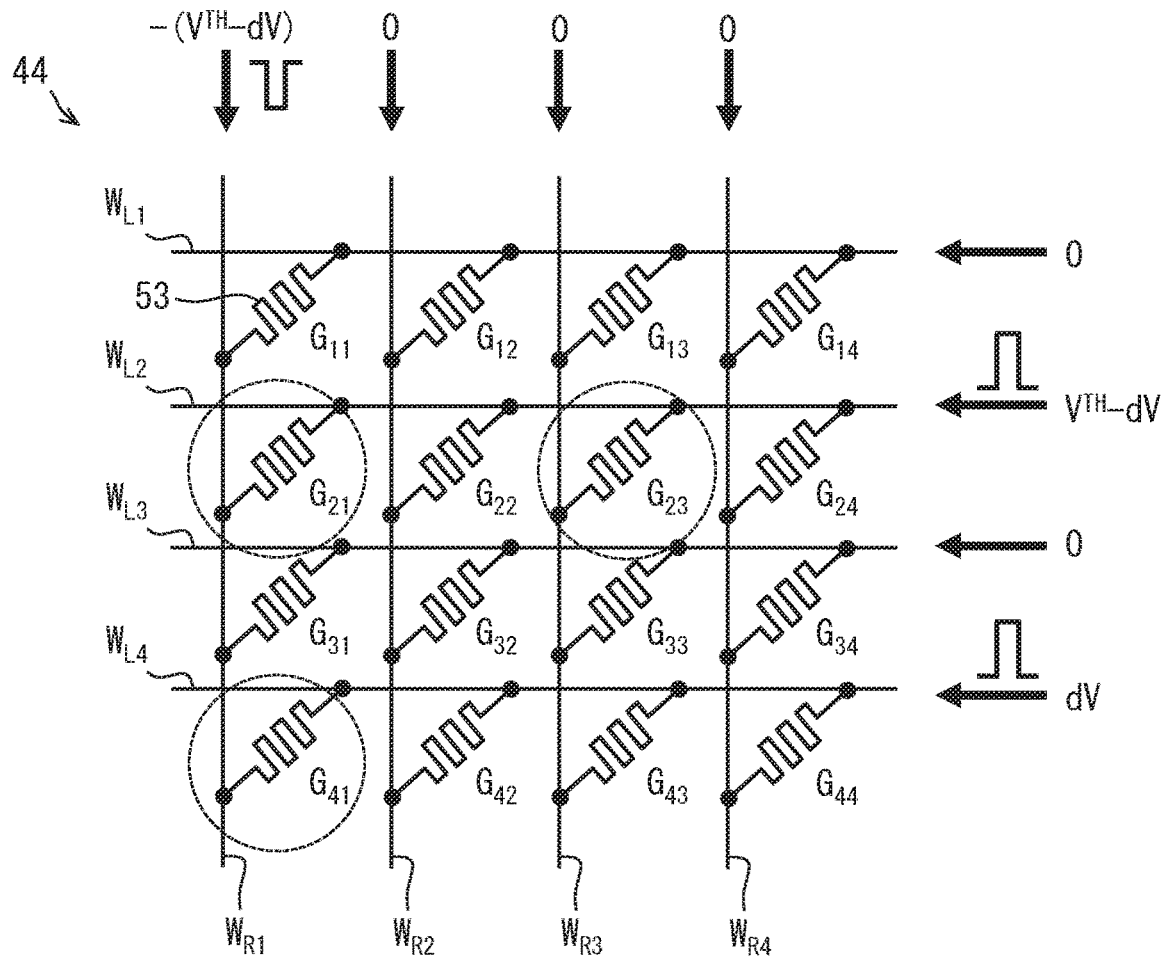
FIG. 8 is a diagram showing a specific example which does not perform intended update of conductance of the memristor constituting the crossbar circuit, and a specific example which performs unintended update of conductance.

FIG. 8 shows a specific example of an unintended update failure and an unintended change of conductance. In the crossbar circuit 44 of FIG. 8, a plurality of input bars $W_{Ri}$ is shown as the plurality of input bars 50. A plurality of output bars $W_{Li}$ is shown as the plurality of output bars 51. Furthermore, the plurality of memristors 53 is shown with symbols $G_{ij}$. FIG. 8 shows a state that a voltage is applied to each of the input bars $W_{Ri}$ and the output bars Wu using the voltage application device 65 with an intention of updating conductance of each of a memristor $G_{21}$ and a memristor $G_{41}$. Specifically, a voltage $V=-(V^{TH}-dV)$ is applied to the input bar $W_{R1}$ of the plurality of input bars $W_{Ri}$, while zero voltage as a reference voltage is applied to the other input bars. In addition, a voltage $V=(V^{TH}-dV)$ is applied to the output bar $W_{L2}$ of the plurality of output bars $W_{Li}$, a voltage $V=dV$ is applied to the output bar $W_{L4}$, and zero voltage as a reference voltage is applied to the other output bars. It is assumed that dV is any positive margin voltage.

When voltages are applied in a manner shown in FIG. 8, a voltage $V=2(V^{TH}-dV)$ is applied to the memristor $G_{21}$ for which a conductance update is intended, while a voltage $V=V^{TH}$ is applied to the other memristor $G_{41}$ for which a conductance update is intended. When the write voltage threshold of the memristor $G_{41}$ is the specified value $V^{TH}$ in this state, conductance of the memristor $G_{41}$ is updated as intended. When the write voltage threshold of the memristor $G_{41}$ is higher than the specified value $V^{TH}$ due to the write voltage threshold variations, the intended update of the conductance of the memristor $G_{41}$ is not achieved. That is, contrary to the intention, the conductance of the memristor $G_{41}$ is not updated. Moreover, when voltages are applied to the respective bars in a manner shown in FIG. 8, the voltage $V=(V^{TH}-dV)$ is also applied to the memristor $G_{23}$ for which a conductance update is not intended. When the write voltage threshold of the memristor $G_{23}$ in this state is the specified value $V^{TH}$, conductance of the memristor $G_{23}$ does not change as intended. When the write voltage threshold of the memristor $G_{23}$ is lower than the specified value $V^{TH}$ due to the write voltage threshold variations, an unintended change of the conductance of the memristor $G_{23}$ may be made. As described above, in the case where the write voltage threshold value of each of the memristors 53 has a variation from the specified value, the intended update of conductance of the memristor 53 is not achieved, or an unintended change is made.

According to the present embodiment, therefore, a write voltage is calculated using the conductance map 64 in the following processing while considering the write voltage threshold variations to reduce an unintended conductance update failure and an unintended conductance change. Moreover, voltages applied to the input bars 50 and the output bars 51 of the crossbar circuit 44 to apply the write voltage to the memristors 53 are again set while considering the write voltage threshold variations.

When approximation of the write voltage threshold variations from the specified value by a Gaussian distribution is allowed, the variations may be expressed by a standard deviation σ of the write voltage threshold around the specified value. In this case, the standard deviation σ increases as the variation from the specified value becomes larger. Alternatively, when approximation by another distribution function is allowed, an amount representing a typical width of this distribution function may be used. An example which uses the standard deviation σ for indicating the write voltage threshold variations will be hereinafter described. The standard deviation (variation) of the write voltage threshold may be measured in advance for the crossbar circuit 44 to which the present processing is applied, may be provided by a supplier (manufacturer) of the crossbar circuit 44, or may be obtained by other methods.

Figure 9:
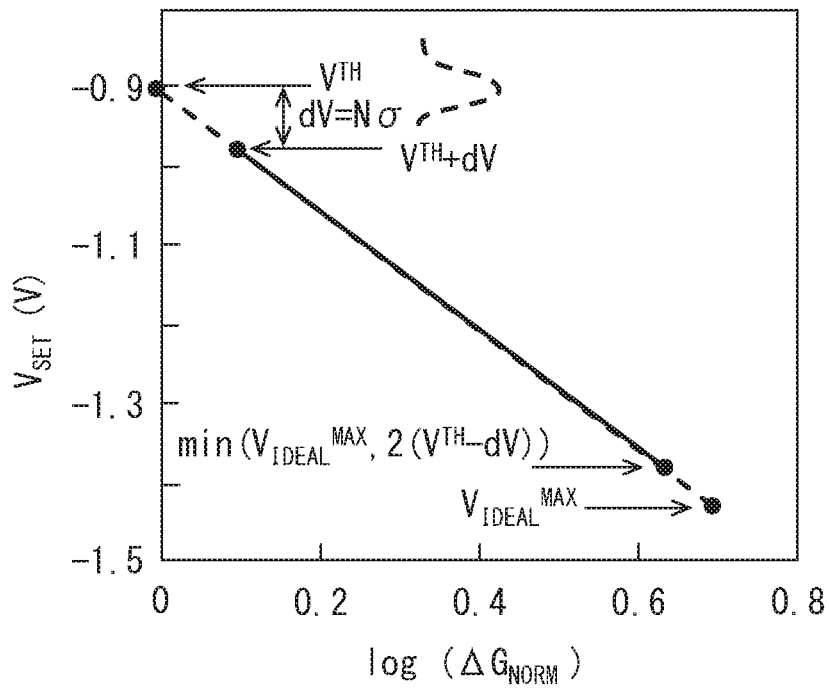
FIG. 9 is a diagram showing an example of a conductance map.
Figure 10:
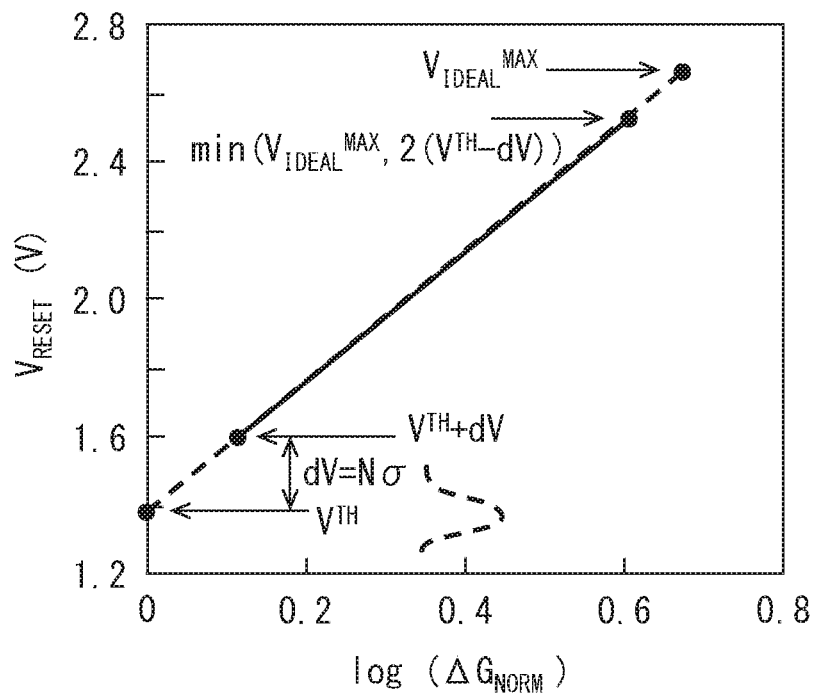
FIG. 10 is a diagram showing an example of a conductance map.

The conductance map 64 will be next described with reference to FIGS. 9 and 10. The conductance map 64 is a predetermined map which shows a relationship between the conductance update amount ΔG and the write voltages $V_{SET}$ and $V_{RESET}$ for achieving the conductance update amount ΔG. Dotted lines in FIGS. 9 and 10 are examples of the conductance map disclosed in WO 2017/010048 A1 and WO 2017/010049 A1. Solid lines in FIGS. 9 and 10 are examples of the conductance map 64 of the present embodiment.

As shown in FIGS. 9 and 10, the minimum write voltage is set to the specified value $V^{TH}$ of the write voltage threshold in the conductance map indicated by the dotted lines. The maximum write voltage is set to a maximum application allowable voltage $V_{IDEAL}^{MAX}$. The maximum application allowable voltage $V_{IDEAL}^{MAX}$ is a voltage value determined such that a failure such as an unintended malfunction of the memristors 53 may be caused when a voltage higher than the maximum application allowable voltage $V_{IDEAL}{}^{MAX}$ is applied to the memristors 53. As described above, a voltage between the specified value $V^{TH}$ and the maximum application allowable voltage $V_{IDEAL}{}^{MAX}$ is defined in the map as a range of the write voltage in the conductance maps of WO 2017/010048 A1 and WO 2017/010049 A1.

The conductance change amount ΔG when a write voltage V is applied to the memristor 53 having a certain value as the conductance value G for an application time Δt is dependent on the conductance value G, the write voltage V, and the application time Δt. In this regard, the application time Δt can be reduced to such a time when the conductance change amount ΔG becomes substantially proportional to the application time Δt. In this case, an approximation can be made such that the conductance change amount ΔG becomes proportional to the application time Δt. This approximation produces the conductance map which does not explicitly include the application time Δt. The dotted maps in FIGS. 9 and 10 are modeled in such a manner that the conductance change amount ΔG is not dependent on the conductance value G. Details of this modeling are described in WO 2017/010048 A1 and WO 2017/010049 A1, and the description in WO 2017/010048 A1 and WO 2017/010049 A1 are herein incorporated by reference.

The conductance map 64 of the present embodiment indicated by the solid line in each of FIGS. 9 and 10 may be an improvement of the maps of WO 2017/010048 A1 and WO 2017/010049 A1 in a following manner. The minimum write voltage defined by the conductance map 64 of the present embodiment is expressed as follows.

$$\text{Minimum write voltage } V_{WRITE}{}^{MIN} = V^{TH} + dV \quad \text{(Equation 3)}$$

Margin voltage $dV = N\sigma$, where $N$ is a real number of 1 or more

This equation indicates that the minimum write voltage is set to the sum of the specified value $V^{TH}$ and the margin voltage dV. The margin voltage dV is obtained by multiplying the standard deviation σ of the write voltage threshold by N which is a predetermined real number of 1 or more. The method of determining the value of N in advance will be described below. The maximum write voltage defined by the conductance map 64 of the present embodiment is expressed by a following equation.

$$\text{Maximum write voltage } V_{WRITE}{}^{MAX} = \min(V_{IDEAL}{}^{MAX}, 2(V^{TH} - dV)) \quad \text{(Equation 4)}$$

This equation indicates that the maximum write voltage is the lower one of the two values, i.e., the value twice higher than the value obtained by subtracting the margin voltage dV from the specified value $V^{TH}$, and the maximum application allowable voltage $V_{IDEAL}{}^{MAX}$. Accordingly, the maximum write voltage is $2(V^{TH}-dV)$ at the highest. This technical meaning will be described below.

When Equation 3 and Equation 4 are combined, the write voltage calculated in S120 becomes a value falling within a following range.

$$\text{Write voltage range} = [Vth + dV; \min(V_{IDEAL}{}^{MAX}, 2(Vth - dV))] \quad \text{(Equation 5)}$$

As described above, according to the conductance map 64 of the present embodiment, the settable write voltage range considering the standard deviation of the write voltage threshold is narrower than that range of each of the conductance maps of WO 2017/010048 A1 and WO 2017/010049 A1. The specific numerical values shown in FIGS. 9 and 10 are device dependent values which are dependent on the memristors 53 to be used. Accordingly, the specific numerical values shown in FIGS. 9 and 10 are presented by way of example. In FIGS. 9 and 10, the horizontal axis indicating the conductance change amount represents a normalized unitless value.

The conductance update process shown in FIG. 7 will be continued.

In S130, the write control device 61 sets voltages applied to the input bars 50 and the output bars 51 of the crossbar circuit 44 to apply the write voltage $V_{WRITE}$ calculated in S120 to the memristors 53. In addition, the calculated set application voltage data is stored in the storage device 63. The voltage setting is made such that the following conditions can be met assuming that the maximum value of the magnitude of the voltage applied to each of the bars is $V^{1/2}$.

$$\text{maximum application voltage applied to each } bar\quad V^{1/2} = V^{TH} - dV \quad \text{(Equation 6)}$$

$$V^{1/2} + V^{1/2} \leq V_{WRITE}{}^{MAX} \quad \text{(Equation 7)}$$

Equation 7 indicates that the sum of the voltage applied to any input bar and the voltage applied to any output bar is equal to or lower than $V_{WRITE}{}^{MAX}$. Examples of the specific method for setting voltages meeting the above conditions include voltage setting based on a V/2 bias method.

The V/2 bias method will be described with reference to FIGS. 11 and 12. According to the V/2 bias method, $V_{50} = \frac{1}{2}V_{WRITE}$ is applied to the input bar 50 to which one end of the selected memristor as a conductance update target using the write voltage $V_{WRITE}$ is connected. Thereafter, $V_{51} = -\frac{1}{2}V_{WRITE}$ is applied to the output bar 51 to which the other end of the selected memristor is connected. Zero voltage as a reference voltage is applied to the other input bars 50 and output bars 51.

Figure 11:
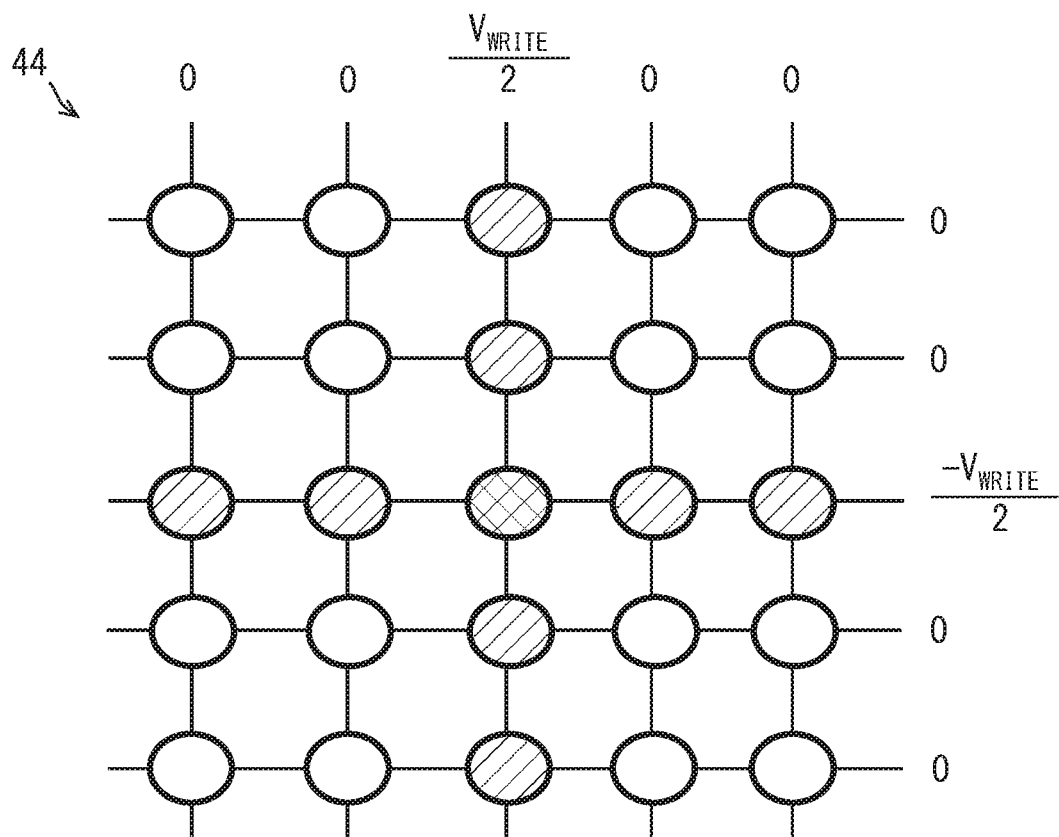
FIG. 11 is a diagram showing an example which applies a write voltage to the crossbar circuit using a V/2 bias method.

FIG. 11 shows an example of voltages set based on the V/2 bias method and applied to the respective input bars 50 and output bars 51 of the crossbar circuit 44. As shown in FIG. 11, the write voltage $V_{WRITE}$ is applied to the selected memristor which is the memristor 53 as a conductance update target using the write voltage $V_{WRITE}$. A Voltage $V = V_{WRITE}/2$ or zero voltage is applied to the non-selected memristors which are the memristors 53 other than the selected memristor.

The magnitude of the write voltage $V_{WRITE}$ to be applied in FIG. 11 is equal to or higher than $V^{TH} + dV$ as indicated in Equation 5. In addition, the margin voltage dV is set based on the standard deviation σ of the write voltage threshold as indicated in Equation 3. Accordingly, even when the actual write voltage threshold of the selected memristor is higher than the specified value $V^{TH}$ due to the write voltage threshold variations, a voltage having a magnitude equal to or higher than the write voltage threshold is likely to be applied to the selected memristor. In this case, the possibility of an unintended conductance update failure of the selected memristor decreases.

The magnitude of the voltage applied to each of the non-selected memristors is $V_{WRITE}/2 = V^{TH} - dV$ at the highest. In other words, the voltage applied to each of the non-selected memristors is equal to or lower than $V^{TH} - dV$. Accordingly, even when the actual write voltage threshold of each of the non-selected memristors is lower than the specified value $V^{TH}$ due to the write voltage threshold variations, a voltage having a magnitude equal to or higher than the write voltage threshold is less likely to be applied to the non-selected memristor. In this case, the possibility of an unintended change of conductance of each of the non-selected memristors decreases.

Figure 12:
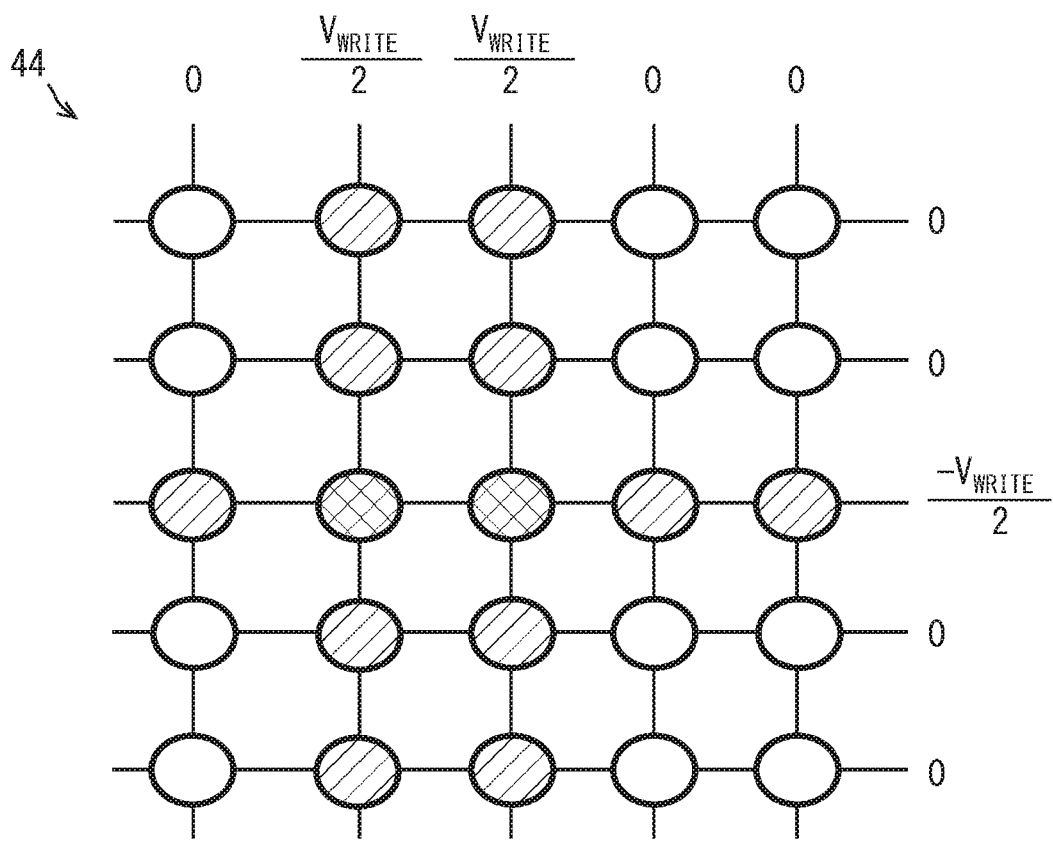
FIG. 12 is a diagram showing another example which applies the write voltage to the crossbar circuit using the V/2 bias method.

FIG. 12 shows another example of voltages set based on the V/2 bias method and applied to the respective bars of the crossbar circuit 44. According to the example of FIG. 12, voltages are applied to the respective bars of the crossbar circuit 44 to apply the write voltage $V_{WRITE}$ to the two selected memristors. In addition, a voltage $V=V_{WRITE}/2$ or zero voltage is applied to each of the non-selected memristors which are the memristors 53 other than the two selected memristors. In this manner, conductance of the plurality of selected memristors can be updated at a time using the V/2 bias method.

Figure 13:
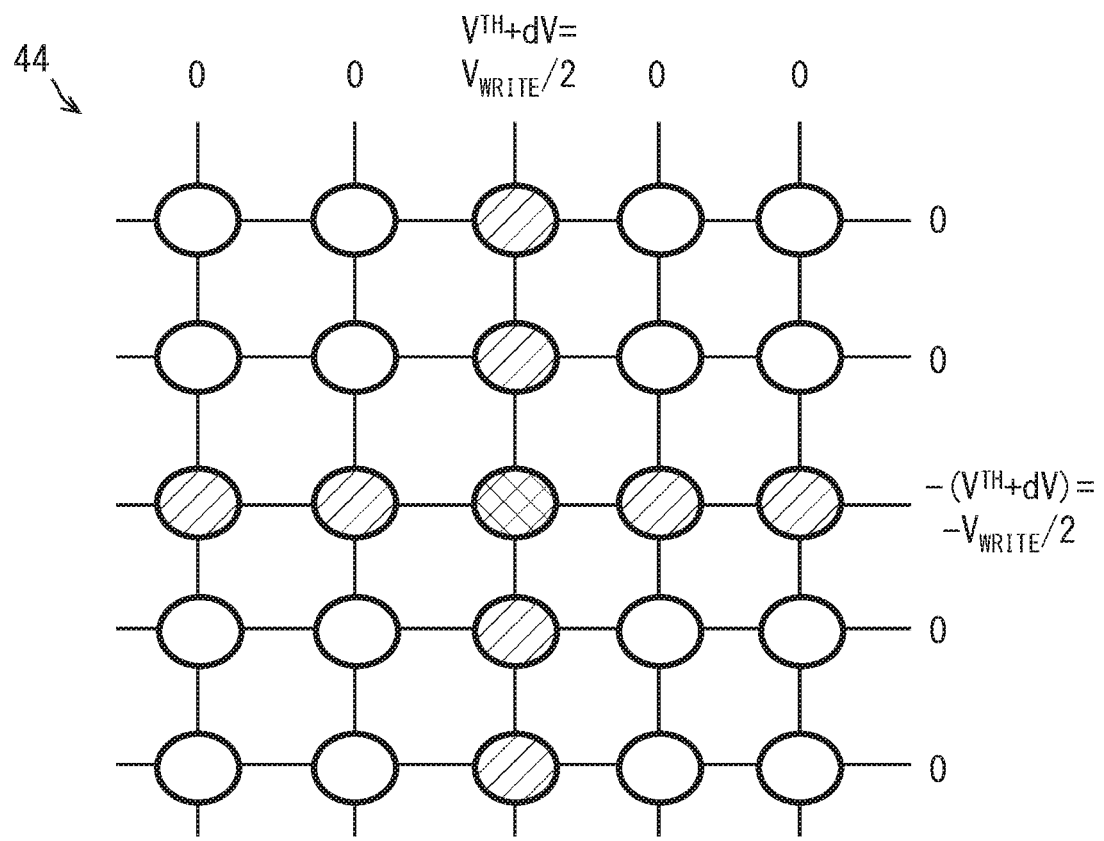
FIG. 13 is a diagram explaining a maximum application voltage applied to each bar of the crossbar circuit.

A meaning that the maximum write voltage value is defined as $2(V^{TH}-dV)$ in Equation 4 at the highest will be next described with reference to FIG. 13. FIG. 13 shows an example which applies voltages to the crossbar circuit 44 based on the V/2 bias method in the state that $V_{WRITE}=2(V^{TH}+dV)$ is set. As shown in FIG. 13, a voltage $V^{TH}+dV$ higher than the specified value of the write voltage threshold is applied to a part of the non-selected memristors. As can be seen from this example, the condition of Equation 4 is established to prevent application of a voltage higher than the specified value of the write voltage threshold to the non-selected memristors.

The description of the conductance update process of FIG. 7 will be continued.

In S140, the write control device 61 transmits the set application voltage data to the voltage application device 65 to apply the setting voltage to each of the input bars 50 and the output bars 51 of the crossbar circuit 44. In this manner, the write control device 61 according to the present embodiment updates conductance of the respective memristors 53 constituting the crossbar circuit 44.

In the training method of the present disclosure, S120 and S130 in the conductance update process described above are implementation examples of an application voltage setting step. S140 is an implementation example of a voltage applying step. The write control device 61 is an implementation example of a training device. The program under which the write control device 61 performs the conductance update process is an implementation example of a training program.

According to the above-described example, the write control device 61 sets voltages to be applied to the crossbar circuit 44 based on the V/2 bias method. The voltages to be applied may be set by another method as long as conditions of Equations 6 to 7 are met. For example, a V/3 bias method or a V/4 bias method described below may also be adopted.

Figure 14:
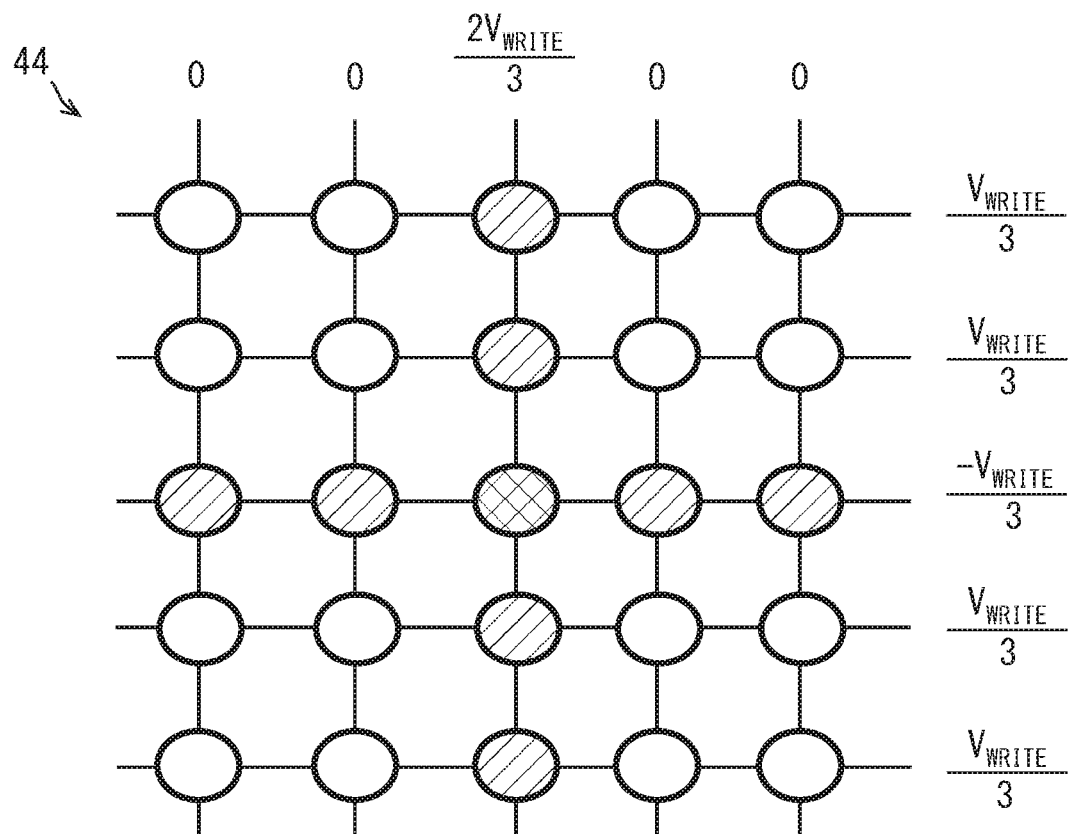
FIG. 14 is a diagram showing an example which applies the write voltage to the crossbar circuit using a V/3 bias method.

FIG. 14 shows an example which applies the write voltage to the crossbar circuit 44 by the V/3 bias method. According to the V/3 bias method, a voltage $V_{50}=\frac{2}{3}V_{WRITE}$ is applied to the input bar 50 to which one end of the selected memristor is connected, and zero voltage is applied to the other input bars 50. In addition, a voltage $V_{51}=-\frac{1}{3}V_{WRITE}$ is applied to the output bar 51 to which the other end of the selected memristor is connected, and a voltage $V=\frac{1}{3}V_{WRITE}$ is applied to the other output bars 51. In this case, it is superficially considered that the condition of Equation 6 is not met. When an extra voltage $V=-\frac{1}{3}V_{WRITE}$ is applied to all the bars, the condition of Equation 6 is met. When voltages are applied to the crossbar circuit 44 in the manner shown in FIG. 14, the magnitude of the voltage applied to the non-selected memristors becomes $V_{WRITE}/3$ which is lower than $V_{WRITE}/2$. Accordingly, similarly to the V/2 bias method, the V/3 bias method decreases both the possibility of an unintended conductance update failure of the selected memristor, and the possibility of an unintended change of conductance of the non-selected memristors. In the V/3 bias method, conductance of a plurality of selected memristors can be similarly updated by applying a voltage at a time to the crossbar circuit 44 based on the same concept as in the description with reference to FIG. 12.

Figure 15:
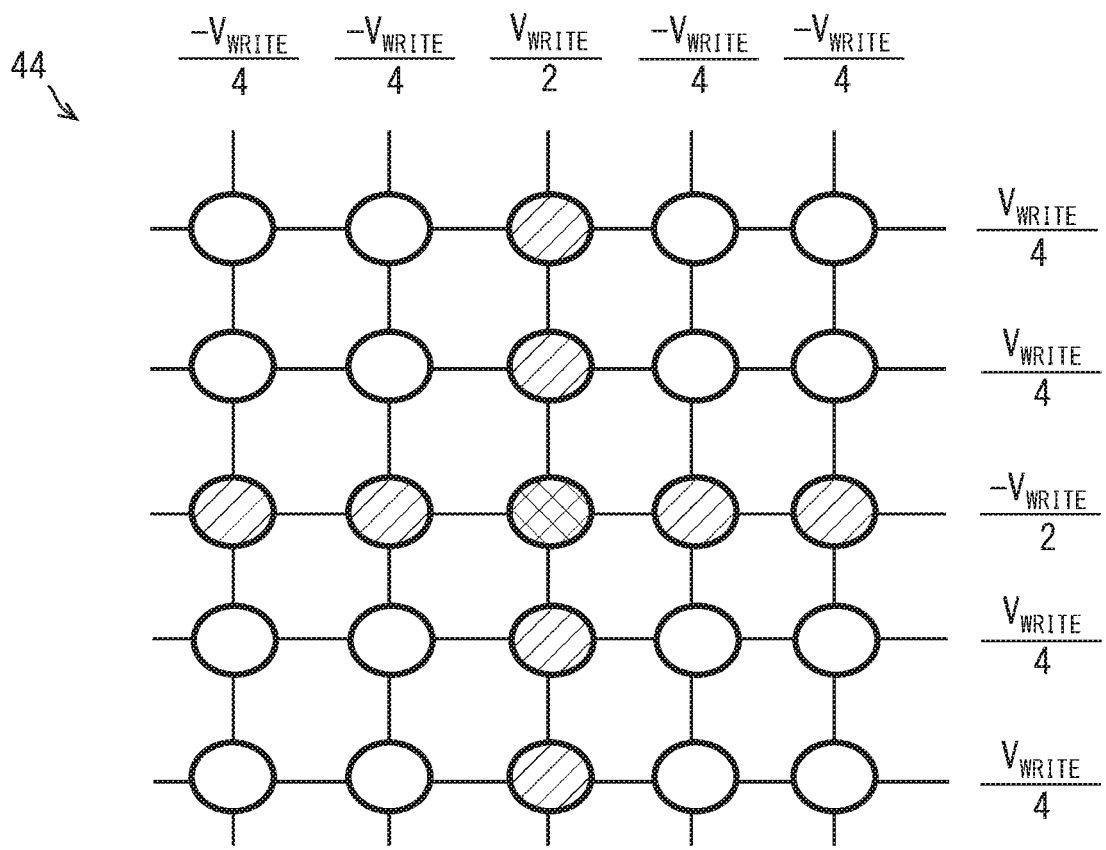
FIG. 15 is a diagram showing an example which applies the write voltage to the crossbar circuit using a V/4 bias method.

FIG. 15 shows an example which applies the write voltage to the crossbar circuit 44 by the V/4 bias method. According to the V/4 bias method, a voltage $V_{50}=\frac{1}{2}V_{WRITE}$ is applied to the input bar 50 to which one end of the selected memristor is connected, and a voltage $V=-\frac{1}{4}V_{WRITE}$ is applied to the other input bars 50. In addition, a voltage $V_{51}=-\frac{1}{2}V_{WRITE}$ is applied to the output bar 51 to which the other end of the selected memristor is connected, and a voltage $V=-\frac{1}{4}V_{WRITE}$ is applied to the other output bars 51. When a voltage is applied to crossbar circuit 44 in this manner, the write voltage $V_{WRITE}$ is applied to the selected memristor as shown in FIG. 15. In addition, the magnitude of the voltage applied to the non-selected memristors becomes the $V_{WRITE}/2$ at the highest. Accordingly, similarly to the V/2 bias method, the V/4 bias method decreases both the possibility of an unintended conductance update failure of the selected memristor, and the possibility of an unintended change of conductance of the non-selected memristors. In the V/4 bias method, conductance of a plurality of selected memristors can be similarly updated by applying a voltage at a time to the crossbar circuit 44 based on the same concept as in the description with reference to FIG. 12.

Numerical experiments (simulations) of the above-described training method will be next described. The numerical experiments were performed by training the software-emulated artificial NN circuit 40 on a computer using the training method of the present embodiment described above. A configuration of the emulated artificial NN circuit 40 will be hereinafter initially described. Subsequently, details of the numerical experiments will be explained.

Figure 16:
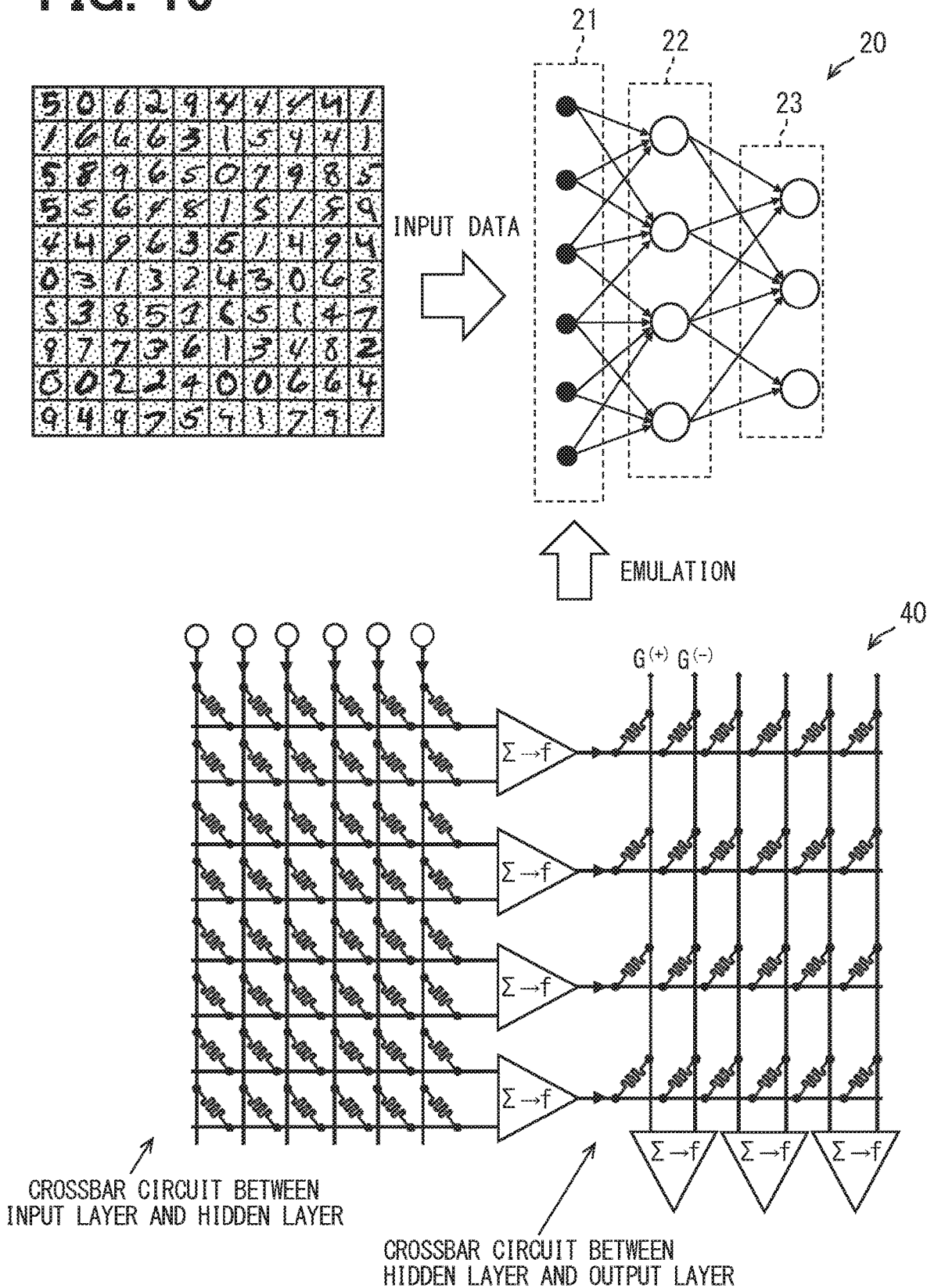
FIG. 16 is a diagram showing a configuration of an artificial NN circuit emulated in a numerical experiment.

FIG. 16 shows the configuration of the emulated artificial NN circuit 40. As shown in FIG. 16, the configuration of the artificial NN circuit 40 which includes the intermediate layer 22 constituted by a single layer was used. The number of the neurons 25 constituting the input layer 21 is 785. The number of the neurons 25 constituting the intermediate layer 22 is 300. The number of the neurons 25 constituting the output layer 23 is 10. An MNIST data set was used as the input data set. Each of input data is a gray image containing 28×28 pixels, as image data indicating any of handwritten numerals of 0 to 9. Each pixel of the image has a value in a range from 0 to 255. Furthermore, a corresponding label such as "7", "2", or "1" is attached to each of the image data. Accordingly, the number of neurons constituting the input layer is 28×28+1=785. In the MNIST data set, 60000 training images and 10000 test images are prepared. In the following numerical experiments, the 50000 images of the 60000 training images were used for training, and the remaining 10000 images were used for evaluation.

First to third numerical experiments were conducted using the configuration of the artificial NN circuit 40 described above and the input data. In each of the numerical experiments, the specified values of the positive and negative write voltage thresholds were set to $V^{TH}=1.4$ V and $V^{TH}=-0.9$ V, respectively. It is assumed that the positive and negative write voltage thresholds of the plurality of memristors 53 constituting the crossbar circuit 44 follow a Gaussian distribution defined by the standard deviation σ with respect to these specified values. The numerical experiments were conducted for six cases of the standard deviation σ=0 V, 0.1 V, 0.05 V, 0.025 V, 0.1 V and 0 V. In other words, the numerical experiments were performed for a plurality of the crossbar circuits 44 having different write voltage threshold variations of the memristors 53. The numerical experiments were conducted for five cases of a plurality of different values N=1, 2, 3, 3.5 and 4 for defining the margin voltage dV=N. Voltages were applied to the crossbar circuit 44 by the V/2 bias method.

The first numerical experiment will be described with reference to FIG. 17. In the first numerical experiment, an unintended conductance change of the non-selected memristor after application of the write voltage is not taken into consideration.

Figure 17:
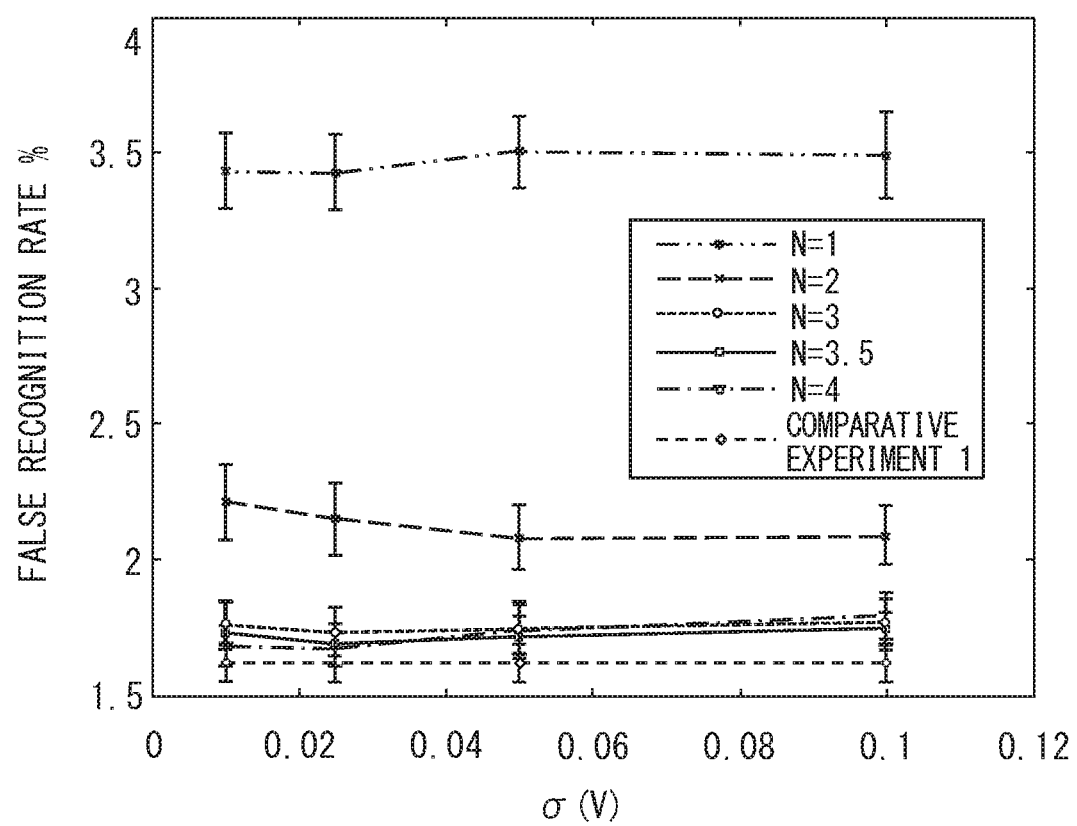
FIG. 17 is a diagram showing results of a first numerical experiment.

FIG. 17 shows results of the first numerical experiment. The horizontal axis represents the standard deviation σ of the write voltage threshold. FIG. 17 shows the results of the write voltage threshold variations of the memristors 53 in the crossbar circuit 44. These variations become larger in the direction toward the right side in the figure. The vertical axis represents a false recognition rate of image data for evaluation after training. The false recognition rate becomes lower in the direction toward the lower side in FIG. 17. In other words, recognition accuracy after training increases in the direction toward the lower side in FIG. 17. A plurality of graphs in the figure each correspond to values of N different from each other. For comparison, a result when the standard deviation σ=0, i.e., when the write voltage threshold of each memristor has a specified value, is labeled as a "comparison experiment 1" in the figure. Concerning the comparative experiment 1, the result should be shown at the position of σ=0 on the horizontal axis. However, this result is shown in a manner presented in FIG. 17 for easy comparison with the results of σ>0.

As shown in FIG. 17, the false recognition rate after training decreases in accordance with an increase in N regardless of the standard deviation σ of the write voltage threshold. In other words, a drop of training accuracy caused by the write voltage threshold variations can considerably decrease. Particularly, when N is 3 or more, the false recognition rate becomes substantially equal to the false recognition when the standard deviation σ=0. This result is achieved for a following reason.

In the state where N is 3 or more, by Equation 3, a voltage having a magnitude equal to or higher than $V^{TH}+3\sigma$ is applied to the selected memristor. In the state where σ is the standard deviation of the write voltage threshold around the specified value $V^{TH}$, the probability that the actual write voltage threshold of the selected memristor becomes lower than $V^{TH}+3\sigma$ due to the write voltage threshold variations becomes 98.9% or higher. Accordingly, the possibility that a voltage having a magnitude equal to or higher than the write voltage threshold is applied to the selected memristor becomes 98.9% or higher.

Based on the characteristics presented by the above results, N for specifying the magnitude of the margin voltage dV can be determined in advance. For example, the value of N is set to 3. Alternatively, the value of N is set based on N dependency concerning the recognition accuracy after training (100%−false recognition rate) and estimated in advance for each of the values of N, and an allowable range of the recognition accuracy determined in advance. Specifically, the following is performed, for example.

The N dependency of the recognition accuracy is estimated in advance by software emulation of the artificial NN circuit 40 in the manner described above. Alternatively, the N dependency of recognition accuracy is estimated in advance by training the artificial NN circuit 40 having the same configuration for each of various values of N, that is, for each of various values of the margin voltage dV, and actually measuring the recognition accuracy of the artificial NN circuit 40 after training. The N dependency of recognition accuracy is compared with the allowable range of the recognition accuracy, and the value of N at which recognition accuracy within the allowable range is achievable is designated as the value of N defining the margin voltage. The allowable range of recognition accuracy is appropriately set in advance in accordance with types of applications implemented by the artificial NN circuit 40, use purposes of applications, and others. Examples of types of applications include applications for image recognition and for voice recognition. Examples of use purposes of applications are applications for autonomous vehicle driving, and for entertainment in vehicles.

In the respective values of N at which recognition accuracy within the allowable range is achievable, the minimum value of N may be set. The minimum value may be set for a following reason. As expressed in Equation 5, the settable write voltage range becomes narrower as the value of N increases. Accordingly, a smaller value of N is more preferable from a viewpoint of securing a sufficient settable range of the write voltage range. On the other hand, a larger value of N is more preferable from a viewpoint of improving the recognition accuracy. Accordingly, in the respective values of N at which the recognition accuracy within the allowable range is achievable, the minimum value of N is adopted to secure both the viewpoints. For example, the following advantages are offered when the settable write voltage range is widened. As can be seen from FIGS. 9 and 10 and the above description concerning these figures, the conductance change amount achievable by one voltage application increases as the settable write voltage range becomes wider. Accordingly, a training time required for achieving a desired conductance change can be shortened by widening the settable write voltage range.

FIG. 18 shows specific numerical examples of the minimum write voltage, the maximum write voltage, and the voltages applied to the respective bars, each voltage specified by Equations 3 to 7. The following is used as feature values of the memristors. The specified values of the positive and negative write voltage thresholds are $V_{RESET}^{TH}=1.4$ V and $V_{SET}^{TH}=-0.9$ V, respectively. The standard deviation of the positive and negative write voltage thresholds is σ=0.05 V. The maximum positive and negative application allowable voltages are $V_{IDEAL}^{MAX}=2.64$ V and −1.41 V, respectively.

An upper part of FIG. 18 shows the maximum write voltage $V_{MAX}$, the minimum write voltage $V^{MIN}$, and the maximum application voltage $V^{1/2}$ applied to each bar. The respective voltages are calculated using Equations 3, 4 and 6 for each value of N. In each case of N=1, 2, and 3, the maximum write voltage $V^{MAX}$ is the maximum application allowable voltage $V_{IDEAL}^{MAX}$. Accordingly, in each case of N=1, 2, and 3, the maximum application allowable voltage $V_{IDEAL}^{MAX}$ is lower than $2(V^{TH}-N\sigma)$. Each of the middle and lower parts of FIG. 18 shows a difference between the maximum write voltage $V^{MAX}$ and the maximum application voltage $V^{1/2}$ applied to each bar. As apparent from the above, the value twice larger than the maximum application voltage applied to each bar does not necessarily meet Equation 7. This point is considered as the meaning of Equation 7.

The second numerical experiment will be next described with reference to FIGS. 19A and 19B. In the second numerical experiment, a conductance change of the non-selected memristor after application of the write voltage to the selected memristor is taken into consideration unlike the first experiment.

Figures 19A, 19B:
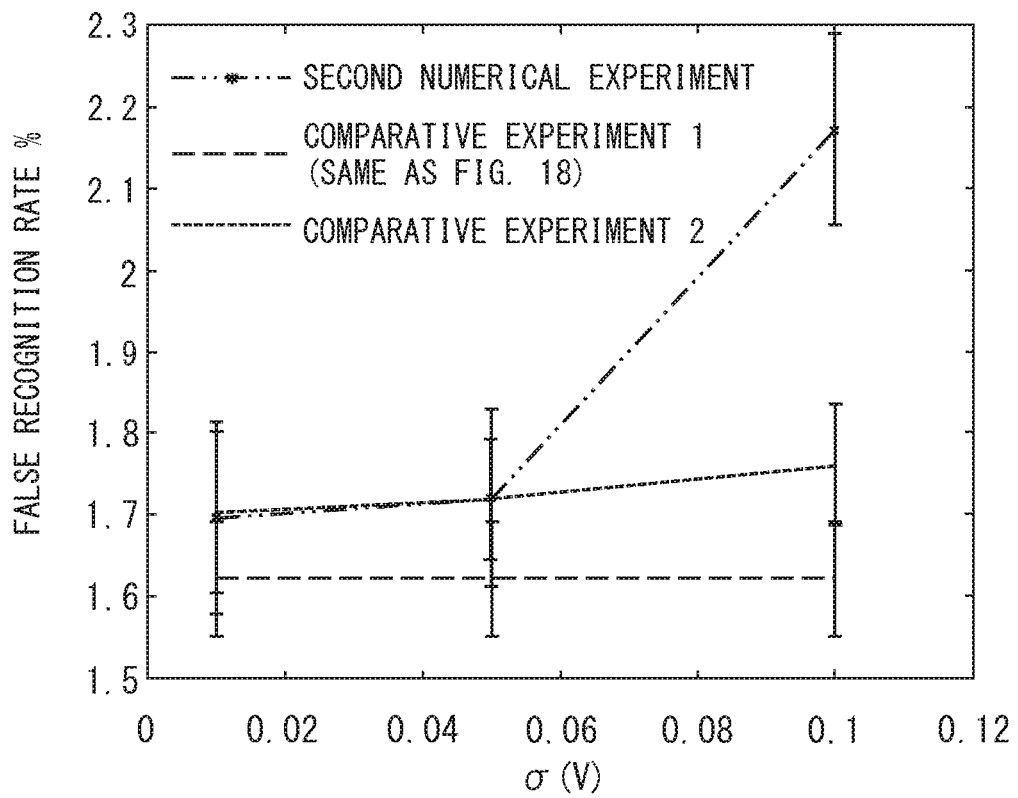
FIG. 19A is a diagram showing results of a second numerical experiment.
FIG. 19B is a diagram showing results of the second numerical experiment.

FIGS. 19A and 19B show a result of the second numerical experiment and parameters used. The comparative experiment 1 in the figure is the same as the comparative experiment 1 in FIG. 17. A "comparative experiment 2" is further shown in the figure for comparison. In the comparative experiment 2, application to the crossbar circuit 44 is set based on Equations 5 to 7 using the standard deviations σ=0.01 V, 0.05 V, and 0.1 V shown in FIG. 19B. However, in the comparative experiment 2, the numerical experiments were performed assuming that each of the memristors constituting the crossbar circuit 44 to which the set application voltage is applied has a specified value as the write voltage threshold. The difference between the comparative experiment 1 and the comparative experiment 2 is that the range of the write voltage determined by Equation 5 is narrower in the comparative experiment 2 than in the comparative experiment 1. As can be seen from the result shown in FIG. 18, factors for decreasing the recognition rate include the available voltage range which is the range of the write voltage determined by Equation 5, and the write voltage threshold.

Figures 20A, 20B:
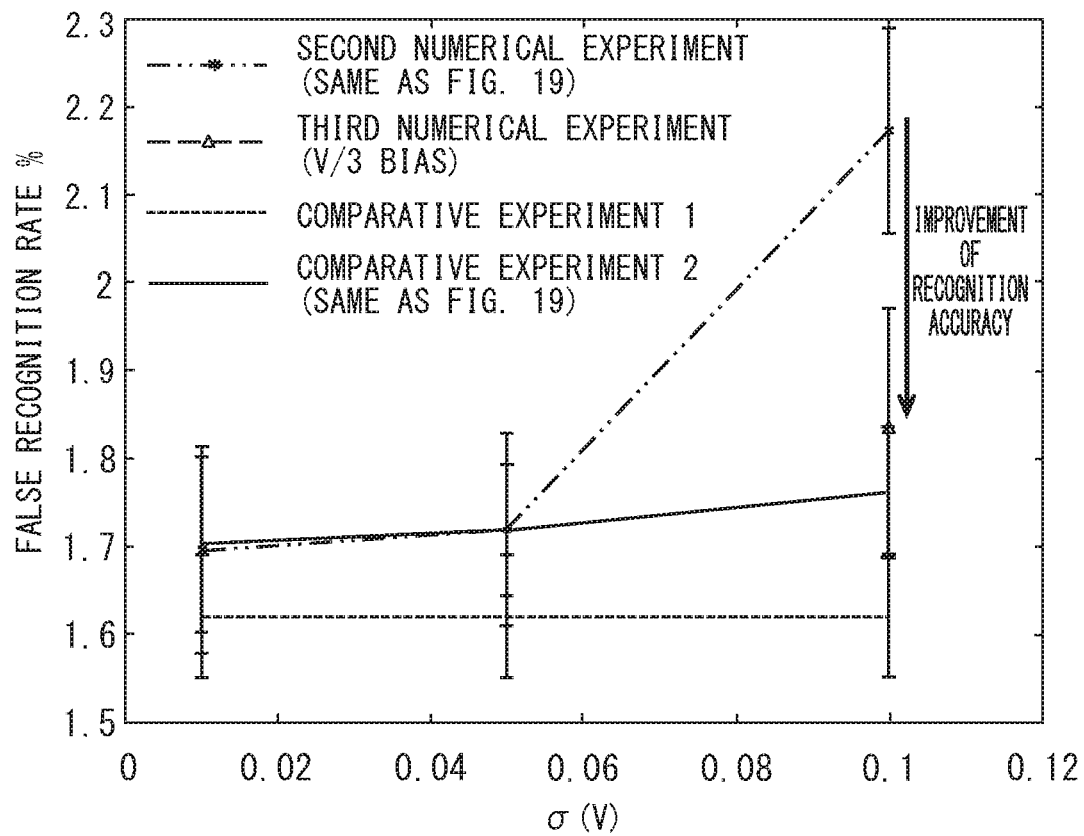
FIG. 20A shows results of a third numerical experiment.
FIG. 20B shows results of the third numerical experiment.

The third numerical experiment will be next described with reference to FIGS. 20A and 20B. FIGS. 20A and 20B show a result of the third numerical experiment together with the result of the second experiment. In the third numerical experiment, voltages were applied to the crossbar circuit 44 by the V/3 bias method. As shown in FIGS. 20A and 20B, a higher recognition rate can be obtained by using the V/3 bias method than the V/2 bias method.

In S140, which of the V/2 bias method, the V/3 bias method, and the V/4 bias method is to be used can be determined from a following viewpoint, for example.

The voltage applied to the selected memristor is the write voltage $V_{WRITE}$ in any voltage application method selected from the ½ bias method, the ⅓ bias method, and the ¼ bias method. On the other hand, the magnitude of the voltage applied to the non-selected memristors differs depending on the voltage application method as shown in FIGS. 11, 12, 14, and 15. Specifically, in the case of use of the ½ bias method, $(½)V_{WRITE}$ is applied to the one non-selected memristor, and a reference voltage (zero voltage) is applied to the other non-selected memristors. In the case of use of the ⅓ bias method, $(⅓)V_{WRITE}$ is applied to the one non-selected memristor, and $(-⅓)V_{WRITE}$ is applied to the other non-selected memristors. In the case of use of the ¼ bias method, $(¼)V_{WRITE}$ is applied to the one non-selected memristor, and a reference voltage $(-½)V_{WRITE}$ is applied to the other non-selected memristors.

Accordingly, from the viewpoint of reducing the possibility of an unintended conductance change of the non-selected memristor, the V/3 bias method is more preferable than the ½ bias method as shown in the third numerical experiment. More specifically, the V/3 bias method is more preferable based on the fact that the magnitude of the voltage applied to the non-selected memristor is generally lower in the case of the V/3 bias method than in the case of the V/2 bias method. In addition, the V/4 bias method is more preferable in some cases than the ½ bias method from the viewpoint of reducing the possibility of an unintended conductance change of the non-selected memristor. More specifically, the V/4 bias method is more preferable based on the fact that the respective magnitudes of the voltages applied to the non-selected memristors, which are (½) $V_{WRITE}$ at the highest, have opposite polarities. More specifically, as shown in FIGS. 9 and 10, the magnitude of the write voltage threshold typically varies in accordance with the polarity of the voltage applied to the memristor. Accordingly, the V/4 bias method is more preferable in some cases than the V/2 bias method.

On the other hand, the V/2 bias method is more preferable than the V/3 bias method and the V/4 bias method from a viewpoint of power consumption by application of voltages to the respective bars of the crossbar circuit 44. The V/2 bias method is more preferable for a following reason. In the V/2 bias method, the reference voltage (zero voltage) is applied to all the bars other than the input bar 50 and the output bar 51 to which the selected memristor is connected. In the V/3 bias method and the V/4 bias method, however, the reference voltage (zero voltage) is not applied.

In consideration of these points, which voltage application method is to be used is determined in S130. Specifically, the voltage application method to be used may be determined based on voltage application method dependency of the input data recognition accuracy after training, and the allowable range of the recognition accuracy determined in advance for each of the voltage application methods. For example, in any of the voltage application methods, voltages are applied using the V/2 bias method consuming low power as long as training producing recognition accuracy within the allowable range is achievable. For example, the V/3 or V/4 bias method consuming high power but capable of securing sufficient recognition accuracy is adopted in a case where training producing recognition accuracy in the allowable range is not achievable by the V/2 bias method, but is achievable by the V/3 or V/4 bias method.

Various methods may be adopted as a method for estimating in advance the voltage application method dependency of the input data recognition accuracy. For example, as shown in the above numerical experiments, the voltage application method dependency of the input data recognition accuracy may be estimated in advance by training the software-emulated artificial NN circuit 40 on a computer. Alternatively, the voltage application method dependency of the input data recognition accuracy may be estimated in advance by on-chip training the artificial NN circuit 40 using the respective voltage application methods, and actually measuring recognition accuracy. The allowable range of recognition accuracy is appropriately set in advance according to types of applications provided in the artificial NN circuit 40, use purposes of applications, and others.

The present disclosure is not limited to the preferred embodiments of the present disclosure described above. Various modifications may be made without departing from the subject matter of the present disclosure.

For example, the CMOS circuits 55 and 56 are presented as an example of the configuration for implementing the neurons 24 in the artificial NN circuit 40 in the above embodiment. However, the neurons 24 may be implemented by other dedicated circuits, implemented by a general-purpose computer, or implemented by a combination of these.

In the above embodiment, the margin voltage dV is set to dV=Nσ by using the standard deviation σ of the write voltage threshold, and N which is a real number of 1 or more. However, the margin voltage dV may be set to dV=N(σ+α)≥Nσ in consideration of factors other than variations in the write voltage threshold. For example, the margin voltage may be set to dV=N(σ+α) in consideration of a magnitude of an application voltage error α representing the voltage application accuracy of the voltage application device 65. In this manner, a drop of training accuracy produced by the application voltage error of the voltage application device 65 can be reduced.

It is preferable that the application voltage error a of the voltage application device 65 used in the voltage applying step S150 is set in advance based on the standard deviation σ of the write voltage threshold. For example, the application voltage error a is made smaller than the standard deviation σ of the write voltage threshold to prevent in advance such a condition that the application voltage error a becomes a main factor for dropping the training accuracy.

The write control device 61 corresponds to an example of a training device.

The present embodiment may have various forms, such as a computer readable non-transitory storage medium where a program is recorded, and a program product stored in a computer readable non-transitory storage medium.

It is noted that a flowchart or the processing of the flowchart in the present application includes multiple steps (also referred to as sections), each of which is represented, for instance, as S110. Further, each step can be divided into several sub-steps while several steps can be combined into a single step.

While various embodiments, configurations, and aspects of an artificial neural network circuit training method, training program, and training device according to the present disclosure have been exemplified, the embodiments, configurations, and aspects of the present disclosure are not limited to those described above. For example, embodiments, configurations, and aspects obtained from an appropriate combination of technical elements disclosed in different embodiments, configurations, and aspects are also included within the scope of the embodiments, configurations, and aspects of the present disclosure.

What is claimed is:

1. A method for training an artificial neural network circuit, the artificial neural network circuit including
   a crossbar circuit that has:
   a plurality of input bars;
   a plurality of output bars crossing the plurality of input bars; and
   memristors each of which includes a variable conductance element provided at corresponding one of intersections of the input bars and the output bars,
   wherein:
   each of the memristors has a characteristic that a conductance is updated in response to a write voltage $V_{WRITE}$ having a magnitude equal to or higher than a write voltage threshold being applied, and that the conductance is maintained in response to a voltage having a magnitude lower than the write voltage threshold being applied;
   a magnitude of the write voltage threshold has a variation with respect to a specified value $V^{TH}$,
   a memristor in the memristors targeted for an update of the conductance by the write voltage $V_{WRITE}$ is a selected memristor;
   a memristor other than the selected memristor is a non-selected memristor;
   a voltage $V_{50}$ is applied to an input bar to which one end of the selected memristor is connected;
   a voltage $V_{51}$ is applied an output bar to which a different end of the selected memristor is connected;
   the method comprising:
   an application voltage setting step that
   sets the voltages $V_{50}$, $V_{51}$ to satisfy a relationship of $V^{TH}+dV \leq |V_{50}-V_{51}| = |V_{WRITE}| \leq 2(V^{TH}-dV)$, in which the dV is a voltage meeting a positive margin voltage, in which a magnitude of the margin voltage is set based on a write voltage threshold variation of the memristors, and
   sets voltages applied to an input bar other than the input bar to which the one end of the selected memristor is connected and an output bar other than the output bar to which the different end of the selected memristor is connected to voltages producing a voltage difference smaller than $V^{TH}-dV$ at both ends of the non-selected memristor; and
   a voltage applying step that applies the voltages set by the application voltage setting step to the input bars and the output bars with a voltage application device.

2. The method according to claim 1, wherein:
the write voltage threshold variation is a standard deviation σ of the write voltage threshold around the specified value $V^{TH}$; and
the margin voltage meets $dV \geq N\sigma$, in which the N is a real number of 1 or more.

3. The method according to claim 2, wherein:
the N is a real number of 3 or more.

4. The method according to claim 2, wherein:
a value of the N is set based on an N dependency of input data recognition accuracy after training, the N dependency being estimated for each value of the N in advance, and based on an allowable range of a predetermined recognition accuracy.

5. The method according to claim 4, wherein:
the value of the N is set to a value corresponding to a minimum value within the allowable range of the recognition accuracy based on the N dependency and based on the allowable range.

6. The method according to claim 2, wherein:
a maximum value $V^{1/2}$ of magnitudes of voltages applied to the input bars and the output bars set in the application voltage setting step is $V^{1/2}=V^{TH}-N\sigma$;
a maximum write voltage $V^{MAX}$ set in the application voltage setting step to the selected memristor is $V^{MAX}=\min(V_{IDEAL}^{MAX}, 2(V^{TH}-N\sigma))$, in which a maximum application allowable voltage of the memristors is $V_{IDEAL}^{MAX}$; and
a sum of a voltage applied to any input bar and a voltage applied to any output bar satisfies $V^{1/2}+V^{1/2} \leq V^{MAX}$.

7. The method according to claim 2, wherein:
a magnitude of an application voltage error that represents a voltage application accuracy of the voltage application device is α; and
the margin voltage satisfies $dV=N(\sigma+\alpha)$.

8. The method according to claim 7, wherein:
the voltage application device used in the voltage applying step has the application voltage error a set based on the standard deviation σ.

9. The method according to claim 1, wherein:
the voltage applying step adopts a V/2 bias method in which,
the voltages $V_{50}$, $V_{51}$ satisfy:

$$V_{50}=V_{WRITE}/2;$$

$$V_{51}=-V_{WRITE}/2; \text{ and}$$

$$V^{TH}+dV \leq |V_{WRITE}| \leq 2(V^{TH}-dV)$$

and
a zero voltage as a reference voltage is applied to the input bar other than the input bar to which the one end of the selected memristor is connected and the output bar other than the output bar to which the different end of the selected memristor is connected.

10. The method according to claim 9, wherein:

the voltage applying step is configured to adopt a V/3 bias method and a V/4 bias method, in addition to the V/2 bias method;

the V/3 bias method applies the voltages $V_{50}$, $V_{51}$ that satisfy:

$V_{50} = V_{WRITE}(\frac{2}{3})$;

$V_{51} = -V_{WRITE}(\frac{1}{3})$; and $V^{TH} + dV \le |V_{WRITE}| \le 2(V^{TH} - dV)$, and the V/3 bias method applies the zero voltage as the reference voltage to the input bar other than the input bar to which the one end of the selected memristor is connected, the V/3 bias method applies a voltage $V_{WRITE}(\frac{1}{3})$ to the output bar other than the output bar to which the other end of the selected memristor is connected, and the V/4 bias method applies the voltages $V_{50}$, $V_{51}$ that satisfy:

$V_{50} = V_{WRITE}(\frac{1}{2})$;

$V_{51} = -V_{WRITE}(\frac{1}{2})$; and $V^{TH} + dV \le |V_{WRITE}| \le 2(V^{TH} - dV)$, and the V/4 bias method applies a voltage $-V_{WRITE}(\frac{1}{4})$ to the input bar other than the input bar to which the one end of the selected memristor is connected, and the V/4 bias method applies a voltage $+V_{WRITE}(\frac{1}{4})$ to the output bar other than the output bar to which the other end of the selected memristor is connected, and the application voltage setting step determines which voltage application method of the V/2 bias method, the V/3 bias method, and the V/4 bias method is adopted in the voltage applying step based on voltage application method dependency of input data recognition accuracy after training, the voltage application method dependency being estimated for each of the voltage applying methods in advance, and based on a predetermined allowable range of the recognition accuracy.

11. A computer-readable non-transitory tangible storage medium that stores a training program for training the artificial neural network circuit that causes a computer that constitutes a training device to perform the application voltage setting step and the voltage applying step according to claim 1.

12. A training device of the artificial neural network circuit, which performs the application voltage setting step and the voltage applying step according to claim 1.

* * * * *